United States Patent
Pierrat et al.

(10) Patent No.: US 6,665,856 B1
(45) Date of Patent: Dec. 16, 2003

(54) DISPLACING EDGE SEGMENTS ON A FABRICATION LAYOUT BASED ON PROXIMITY EFFECTS MODEL AMPLITUDES FOR CORRECTING PROXIMITY EFFECTS

(75) Inventors: Christophe Pierrat, Santa Clara, CA (US); Youping Zhang, Newark, CA (US)

(73) Assignee: Numerical Technologies, Inc., Mountain View, CA (US)

( * ) Notice: Subject to any disclaimer, the term of this patent is extended or adjusted under 35 U.S.C. 154(b) by 460 days.

(21) Appl. No.: 09/728,885

(22) Filed: Dec. 1, 2000

(51) Int. Cl.$^7$ ................................................ G06F 17/50
(52) U.S. Cl. ........................................ 716/19; 716/21
(58) Field of Search ................. 716/19–21; 382/144; 430/5

(56) References Cited

U.S. PATENT DOCUMENTS

| | | | |
|---|---|---|---|
| 4,231,811 A | 11/1980 | Somekh et al. | 148/1.5 |
| 4,426,584 A | 1/1984 | Bohlen et al. | 250/492.2 |

(List continued on next page.)

FOREIGN PATENT DOCUMENTS

| | | |
|---|---|---|
| GB | 2324169 A1 | 10/1998 |
| JP | 3-80525 | 4/1991 |
| JP | 3-210560 | 9/1991 |
| JP | 8-236317 | 9/1996 |
| JP | 10-133356 | 5/1998 |
| JP | 11-143085 | 5/1999 |
| WO | WO 99/47981 | 9/1999 |
| WO | WO 00/67074 | 11/2000 |
| WO | WO 00/67075 | 11/2000 |
| WO | WO 00/67076 | 11/2000 |

OTHER PUBLICATIONS

Cobb, N., et al., "Fast, Low–Complexity Mask Design", SPIE, vol. 2440, pp. 313–327, Feb. 22–24, 1995.
Cobb, N., et al., "Experimental Results on Optical Proximity Correction With Variable Threshold Resist Model", SPIE, vol. 3051, pp. 458–468, Mar. 12–14, 1997.
Cobb, N., "Fast Optical and Process Correction Algorithms for Integrated Circuit Manufacturing", Dissertation, University of California at Berkeley, UMI Microform 9902038 (139 pages).
Toublan, O., et al., "Phase Aware Proximity Correction for Advanced Masks", SPIE, vol. 4000, pp. 160–170, Mar. 1–3, 2000.
Chuang, H., et al., "Practical Applications of 2–D Optical Proximity Corrections for Enhanced Performance of 0.25 $\mu$m Random Logic Devices", IEEE, pp. 18.7.1–18.7.4, Dec. 1997.

(List continued on next page.)

*Primary Examiner*—Matthew Smith
*Assistant Examiner*—Paul Dinh
(74) *Attorney, Agent, or Firm*—Bever, Hoffman & Harms, LLP; Jeanette S. Harms

(57) ABSTRACT

Techniques for forming a fabrication layout, such as a mask, for a physical design layout, such as a layout for an integrated circuit, include correcting the fabrication layout for proximity effects using a proximity effects model. A proximity effects model is executed to produce an initial output. The initial output is based on a first position for a segment in a fabrication layout. The first position is displaced from a corresponding original edge in the original fabrication layout by a distance equal to an initial bias. The model is also executed to produce a second output based on a second position for the segment. The second position is displaced from the corresponding original edge by a distance equal to a second bias. An optimal bias for the segment is determined based on the initial output and the second output. The segment is displaced in the fabrication layout from the corresponding edge based on the optimal bias.

60 Claims, 19 Drawing Sheets

U.S. PATENT DOCUMENTS

| | | | |
|---|---|---|---|
| 4,456,371 A | 6/1984 | Lin .............................. 355/71 |
| 4,812,962 A | 3/1989 | Witt |
| 4,895,780 A | 1/1990 | Nissan-Cohen et al. ........ 430/5 |
| 4,902,899 A | 2/1990 | Lin et al. .................. 250/492.1 |
| 5,051,598 A | 9/1991 | Ashton et al. |
| 5,182,718 A | 1/1993 | Harafugi et al. |
| 5,208,124 A | 5/1993 | Sporon-Fiedler et al. ...... 430/5 |
| 5,241,185 A | 8/1993 | Meiri et al. |
| 5,242,770 A | 9/1993 | Chen et al. |
| 5,256,505 A | 10/1993 | Chen et al. |
| 5,316,878 A | 5/1994 | Saito et al. |
| 5,326,659 A | 7/1994 | Liu et al. |
| 5,340,700 A | 8/1994 | Chen et al. |
| 5,424,154 A | 6/1995 | Borodovsky |
| 5,432,714 A | 7/1995 | Chung et al. |
| 5,447,810 A | 9/1995 | Chen et al. |
| 5,498,579 A | 3/1996 | Borodovsky et al. ........ 437/250 |
| 5,533,148 A | 7/1996 | Sayah et al. |
| 5,538,815 A | 7/1996 | Oi et al. |
| 5,553,273 A | 9/1996 | Liebmann |
| 5,553,274 A | 9/1996 | Liebmann ................... 395/500 |
| 5,572,598 A | 11/1996 | Wihl et al. |
| 5,631,110 A | 5/1997 | Shioiri et al. |
| 5,636,002 A | 6/1997 | Garofalo ...................... 355/53 |
| 5,657,235 A | 8/1997 | Liebmann et al. |
| 5,663,017 A | 9/1997 | Schinella et al. .............. 430/5 |
| 5,663,893 A * | 9/1997 | Wampler et al. .............. 716/19 |
| 5,682,323 A | 10/1997 | Pasch et al. ................. 364/491 |
| 5,702,848 A | 12/1997 | Spence |
| 5,705,301 A | 1/1998 | Garza et al. |
| 5,707,765 A | 1/1998 | Chen |
| 5,723,233 A | 3/1998 | Garza et al. ................... 430/5 |
| 5,740,068 A | 4/1998 | Liebmann et al. |
| 5,766,806 A | 6/1998 | Spence ......................... 430/5 |
| 5,795,688 A | 8/1998 | Burdorf et al. |
| 5,801,954 A | 9/1998 | Le et al. |
| 5,804,340 A | 9/1998 | Garza et al. |
| 5,815,685 A | 9/1998 | Kamon |
| 5,821,014 A | 10/1998 | Chen et al. .................... 430/5 |
| 5,825,647 A | 10/1998 | Tsudaka |
| 5,827,623 A | 10/1998 | Ishida et al. |
| 5,847,959 A | 12/1998 | Veneklasen et al. |
| 5,849,440 A | 12/1998 | Lucas et al. |
| 5,862,058 A | 1/1999 | Samuels et al. ............ 364/491 |
| 5,863,682 A | 1/1999 | Abe et al. |
| 5,879,844 A | 3/1999 | Yamamoto et al. ........... 430/30 |
| 5,885,734 A | 3/1999 | Pierrat et al. ................... 430/5 |
| 5,900,338 A | 5/1999 | Garza et al. .................... 430/5 |
| 5,958,635 A | 9/1999 | Reich et al. ................... 430/30 |
| 5,972,541 A | 10/1999 | Sugasawara et al. ........... 430/5 |
| 5,991,006 A | 11/1999 | Tsudaka ....................... 355/53 |
| 5,994,002 A | 11/1999 | Matsuoka ...................... 430/5 |
| 6,004,702 A | 12/1999 | Lin ............................... 430/5 |
| 6,007,310 A | 12/1999 | Jacobsen et al. ............ 417/362 |
| 6,014,456 A | 1/2000 | Tsudaka ..................... 382/144 |
| 6,077,310 A | 6/2000 | Yamamoto et al. ........... 716/19 |
| 6,078,738 A | 6/2000 | Garza et al. ........... 395/500.22 |
| 6,081,658 A | 6/2000 | Rieger et al. |
| 6,114,071 A | 9/2000 | Chen et al. .................... 430/5 |
| 6,154,563 A | 11/2000 | Tsudaka ..................... 382/144 |
| 6,243,855 B1 | 6/2001 | Kobayashi et al. ........... 716/19 |
| 6,249,597 B1 | 6/2001 | Tsudaka ..................... 382/144 |
| 6,289,499 B1 | 9/2001 | Rieger et al. ................. 716/21 |
| 6,298,473 B1 | 10/2001 | Ono et al. ..................... 716/21 |
| 6,416,907 B1 * | 7/2002 | Winder et al. ................. 430/5 |
| 6,453,457 B1 * | 9/2002 | Pierrat et al. ................. 716/19 |
| 6,523,162 B1 * | 2/2003 | Agrawal et al. .............. 716/19 |
| 2002/0100004 A1 | 7/2002 | Pierrat et al. ................... 716/5 |

OTHER PUBLICATIONS

Choi, Y., et al., "Optical Proximity Correction on Attenuated Phase Shifting Mask for Dense Contact Array", LG Semicon Company (11 pages).

Lucas, K., et al., "Model Based OPC for 1st Generation 193nm Lithography", Motorola Inc., IDT assignee to IMEC (12 pages).

Stirniman, J., et al., "Quantifying Proximity and Related Effects in Advanced Wafer Processes", Precim Company, Hewlett Packard Labs (9 pages).

Sugawara, M., et al., "Practical Evaluation of Optical Proximity Effect Correction by EDM Methodology", Sony Corporation (11 pages).

Granik, Y., et al., "MEEF as a Matrix", Mentor Graphics Corporation (11 pages).

Kang, D., et al., "Effects of Mask Bias on the Mask Error Enhancement Factor (MEEF) of Contact Holes" (11 pages).

Matsuura, S., et al., "Reduction of Masks Error Enhancement Factor (MEEF) by the Optimum Exposure Dose Self–Adjusted Mask", NEC Corporation (12 pages).

Saleh, B., et al., "Reduction of Errors of Microphotographic Reproduction by Optimal Corrections of Original Masks", Optical Engineering, vol. 20, No. 5, pp. 781–784, Sep./Oct. 1981.

Fu, C.C., et al., "Enhancement of Lithographic Patterns Using Serif Features", IEEE, Transaction On Electron Devices, vol. 38, No. 12, pp. 2599–2603, Dec. 1991.

Henderson, R., et al., "Optical Proximity Effect Correction: An Emerging Technology", Microlithography World, pp. 6–12 (1994).

Dolainsky, C., et al., "Application of a Simple Resist Model to Fast Optical Proximity Correction", SPIE, vol. 3051, pp. 774–780 (1997).

Chen, J., et al., "Full–Chip Optical Proximity Correction with Depth of Focus Enhancement", Microlithography World,(5 pages) (1997).

Wong, A., et al., "Lithographic Effects of Mask Critical Dimension Error", SPIE, vol. 3334, pp. 106–115 (1998).

Spence, C., et al., "Integration of Optical Proximity Correction Strategies in Strong Phase Design for Poly–Gate Layers", Bacus News, vol. 15, Issue, 12, pp. 1, 4–13, Dec. 1999.

Balasinski, A., et al., "Comparison of Mask Writing Tools and Mask Simulations for 0.16 μm Devices", IEEE, SEMI Advanced Semiconductor Manufacturing Conference, pp. 372–377 (1999).

Ackmann, P. et al., "Phase Shifting And Optical Proximity Corrections To Improve CD Control On Logic Devices In Manufacturing For Sub 0.35 μm I–Line", Advance Micro Devices (8 pages).

Asai, N. et al., "Proposal For The Coma Aberration Dependent Overlay Error Compensation Technology", *Jpn. J. Appl. Phys.*, vol. 37, pp. 6718–6722 (1998).

Chen, J.F. et al., "Full–Chip Optical Proximity Correction With Depth Of Focus Enhancement", *Microlithography World* (1997).

Chen, J.F. et al., "Optical Proximity Correction For Intermediate–Pitch Features Using Sub–Resolution Scattering Bars", MicroUnity System Engineering, Inc., Sunnyvale, California, pp. 1–16.

Chen, J.F., et al., "Practical Method For Full–Chip Optical Proximity Correction", MicroUnity Systems Engineering, Inc., Sunnyvale, California (14 pages).

Garofalo, J. et al., "Automated Layout Of Mask Assist–Features For Realizing $0.5k_1$ ASIC Lithography", SPIE, vol. 2440, pp. 302–312 (1995).

Garofalo, J. et al., "Automatic Proximity Correction For 0.35 μm I–Line Photolithography", IEEE, pp. 92–94 (1994).

Garofalo, J. et al., "Mask Assisted Off–Axis Illumination Technique For Random Logic", J. Vac. Sci. Technol. B, vol. 11, No. 6, pp. 2651–2658, Nov./Dec. 1993.

Gotoh, Y. et al., "Pattern Dependent Alignment Technique For Mix–And–Match Electron–Beam Lithography With Optical Lithography", J. Vac. Sci. Technol. B, vol. 16, No. 6, pp. 3202–3205, Nov./Dec. 1998.

Harafuji, K. et al., "A Novel Hierarchical Approach For Proximity Effect Correction In Electron Beam Lithography", IEEE, vol. 12, No. 10, pp. 1508–1514, Oct. 1993.

Lin, B.J., "Methods To Print Optical Images At Low–$k_1$ Factors", SPIE, Optical/Laser Microlithography III, vol. 1264, pp. 2–13 (1990).

Pierrat, C. et al., "A Rule–Based Approach To E–Beam And Process–Induced Proximity Effect Correction for Phase–Shifting Mask Fabrication", SPIE, vol. 2194, pp. 298–309 (1994).

Precim, "Proxima System", Precim Company, Portland, Oregon (2 pages).

Saleh, B. et al., "Reduction Of Errors Of Microphotographic Reproductions By Optimal Corrections of Original Masks", Optical Engineering, Vo. 20, No. 5, pp. 781–784, Sep./Oct. 1981.

Spence, C. et al., "Integration Of Optical Proximity Correction Strategies In Strong Phase Shifters Design For Poly–Gate Layers", Bacus News, vol. 15, Issue 12, pp. 1, 4–13, Dec. 1999.

Barouch, E., et al., "OPTIMASK: An OPC Algorithm for Chrome and Phase–Shift Mask Design", 2/22–24/95, SPIE vol. 2440, pp. 192–206.

Brunner, T., et al., "Approximate Models for Resist Processing Effects", 198/SPIE vol. 2726, Optical Microlithography IX, Mar. 13–15, 1996, pp. 198–209.

Brunner, T, "Rim Phase–Shift Mask Combined with Off–Axis Illumination: A Path to 0.5λ/Numerical Aperture Geometries", Optical Engineering, Oct. 1993, vol. 32, No. 10, pp. 2337–2343.

Casey, J. Jr., et al., "Chemically Enhanced FIB Repair of Opaque Defects on Molybdenum Silicide Photomasks", Wednesday Poster Session Paper 3236–58, Photomask Technology and Management Technical Program, (1997), SPIE vol. 3236, pp. 487–497.

Chang, K., et al., "Accurate Modeling of Deep Submicron Interconnect Technology", TMA Times, Fall 1997 vol. IX, No. 3.

Cobb, et al., "Fast Sparse Aerial Image Calculation for OPC", SPIE vol. 2621, pp. 534–544.

Gans, F., et al., "Printability and Repair Techniques for DUV Photomasks", Photomask Technology and Management Technical Program, Session 3 Paper, (1998), pp. 136–141.

Ham, Y.M. et al., "Dependence of Defects in Optical Lithography", Jpn. J. Appl. Phys. vol. 31 (1992), pp. 4137–4142.

Henke, W., et al., "A Study of Reticle Defects Imaged Into Three–Dimensional Developed Profiles of Positive Photresist Using the SOLID Lithography Simulator", Microelectronic Engineering 14 (1991) 283–297.

Ibsen, K., et al., "Clear Field Reticle Defect Disposition for Advanced Sub–Half Micron Lithography", (1997), Photomask Technology and Management Technical Program, Session 3 Paper 3236–13.

Ishiwata, N., et al., "Novel Alternating Phase Shift Mask with Improved Phase Accuracy", Photomask Technology and Management Technical Program, Session 7 Paper 3236–28, SPIE vol. 3236.

Jinbo, H., et al., "0.2 μm OR Less i–Line Lithography by Phase–Shifting Mask Technology", Semiconductor Technology Lab., Oki Electric Industry, Co., Ltd., CH2865–4/90/0000–0825, pp. 33.3.1–33.3.4.

Jinbo, H., et al., "Application of Blind Method to Phase–Shifting Lithography", 1992 Symposium on VLSI Technology Digest of Technical Papers, pp. 112–113.

Jinbo, H., "Improvement of Phase–Shifter Edge Line Mask Method", Japanese Journal of Applied Physics, vol. 30, No. 11B, Nov., 1991, pp. 2998–3003.

Karklin, Linard, "A Comprehensive Simulation Study of the Photomask Defects Printability", SPIE vol. 2621, pp. 490–504.

Kimura, T., et al., "Subhalf–Micron Gate GaAs Mesfet Process Using Phase–Shifting–Mask Technology", GaAs IC Symposium, 1991, pp. 281–284.

Lithas: Optical Proximity Correction Software.

MicroUnity: OPC Technology & Product Description, pp. 1–5.

Morimoto, H., et al., "Next Generation Mask Strategy–Technologies are Ready for Mass Production of 256MDRAM?", (Panel discussion of PMJ'97 on Apr. 18, 1997), SPIE vol. 3236 pp. 188–189.

Nistler, J., et al., "Large Area Optical Design Rule Checker for Logic PSM Application", SPIE vol. 2254 Photomask and X–Ray Mask Technology (1994), pp. 78–92.

Nistler, J., et al., "Phase Shift Mask Defect Printability Analysis", Eytan Barouch and Uwe Hollerbach, Princeton University, Princeton, NJ, pp. 11–27.

Ohtsuka, H., et al., "Phase Defect Repair Method for Alternating Phase Shift Masks Conjugate Twin–Shifter Method", Jpn. J. Appl. Phys. vol. 31, Part 1, No. 12B, (1992) pp. 4143–4149.

Park, C., et al., "An Automatic Gate CD Control for a Full Chip Scale SRAM Device", CAE, Process Development Team, Semiconductor R&D Center, Samsung Electronics Co, Ltd, SPIE vol. 3236, (1997), pp. 350–356.

Pati, Y.C., et al., "Exploiting Structure in Fast Aerial Image Computation for Integrated Circuit Patterns", IEEE Transactions on Semiconductor Manufacturing, vol. 10, No. 1, Feb. 1997, pp. 62–74.

Pati, Y.C., et al., "Phase–Shifting Masks for Microlithography: Automated Design and Mask Requirements," J. Opt. Soc. Am. A/vol. 11, No.9/Sep. 1994, pp. 2438–2452.

"Proxima System," Precim Company, Portland, Oregon (2 pages).

"Proxima Wafer Proximity Correction System", Precim Company, Portland, Oregon (2 pages).

Rieger, M., et al., "Customizing Proximity Correction for Process–Specific Objectives", Precim Company, (1996), SPIE, vol. 2726, pp. 651–659.

Rieger, M., et al., "Mask Fabrication Rules for Proximity–Corrected Patterns", Precim Company, Portland, Oregon.

Rieger, M., et al., "Proxima System Theory of Operation", Aug. 23, 1993, pp. 1–20.

Rieger, M., et al., "V–Domain Definition", Sep. 8, 1993, pp. 1–7.

Rieger, M., et al., "Using Behavior Modeling for Proximity Correction", Precim Company, SPIE 1994.

Roman, B., et al., "Implications of Device Processing on Photomask CD Requirements", (Motorola Advanced Products Research and Development Laboratory, Austin, TX 78762), Photomask Technology and Management Technical Program, Session 8, Paper 3236–31,, p. 51.

Spence, C., et al., "Automated Determination of CAD Layout Failures Through Focus: Experiment and Simulation", SPIE vol. 2197, (1994), pp. 302–313.

Spence, C., et al., "Detection of 60° Phase Defects on Alternating PSMs", Advanced Micro Devices, KLA–Tencor DuPoint TRC.

Stirniman, J., et al., "Fast Proximity Correction with Zone Sampling", SPIE vol. 2197 (1994), pp. 294–301.

Stirniman, J., et al., "Optimizing Proximity Correction for Wafer Fabrication Processes", SPIE vol. 2322, Photomask Technology and Management (1994), pp. 239–246.

Stirniman, J., et al., "Spatial Filter Models to Describe IC Lithographic Behavior", Precim Corporation, Portland, Oregon.

Stirniman, J., et al., "Wafer Proximity Correction and Its Impact on Mask–Making", Bacus News, Photomask, Jan. 1994, vol. 10, Issue 1, p. 1, 3–7, 10–12.

Sugawara, M., et al., "Defect Printability Study of Attenuated Phase–Shifting Masks for Specifying Inspection Sensitivity", Semiconductor Company, Sony Corporation, Kanagawa, Japan.

Trans Vector Technologies, Inc: "Now Better Quality Photomasks", OPRX, 4 pages.

Vacca, A., et al., "100nm, Defect Detection Using a Dynamically Programmable Image Processing Algorithm", Photomask Technology and Management Technical Program, Session 6 Paper 3236–24.

Vacca, A., et al., "100 nm Defect Detection Using an Existing Image Acquisition System", (1998), SPIE, vol. 3236, pp. 208–214.

Watanabe, H., et al., "Detection and Printability of Shifter Defects in Phase–Shifting Masks II. Defocus Characteristics", Jpn. J. Appl. Phys. vol. 31 (1992) Pt. 1, No. 12B, pp. 4155–4160.

Wiley, J., et al., "Device Yield and Reliability by Specification of Mask Defects", SolidState Technology, Lithography.

Wiley, J., et al., "The Effect of Off–Axis Illumination on the Printability of Opaque and Transparent Reticle Defects", SPIE vol. 2512, (1995), pp. 432–440.

Wiley, J., et al., "Phase Shift Mask Pattern Accuracy Requirements and Inspection Technology", SPIE vol. 1364 Integrated Circuit Metrology, Inspection and Process Control V (1991).

Yen, A., et al., "Characterization and Correction of Optical Proximity Effects in Deep–Ultraviolet Lithography Using Behavior Modeling", J. Vac. Sci. Technol. B 14(6), Nov./Dec. 1996, pp. 4175–4178.

* cited by examiner

DISPLACING EDGE SEGMENTS ON A FABRICATION LAYOUT BASED ON PROXIMITY EFFECTS MODEL AMPLITUDES FOR CORRECTING PROXIMITY EFFECTS

RELATED APPLICATIONS

This application is related to U.S. patent application Ser. No. 09/675,582, entitled "Dissection Of Corners In A Fabrication Layout For Correcting Proximity Effects," filed on Sep. 29, 2000, invented by Christophe Pierrat and Youping Zhang.

This application is related to U.S. patent application Ser. No. 09/675,197, entitled "Dissection Of Edges With Projection Points In A Fabrication Layout For Correcting Proximity Effects," filed on Sep. 29, 2000, invented by Christophe Pierrat and Youping Zhang.

This application is related to U.S. patent application Ser. No. 09/1676,375, entitled "Dissection Of Printed Edges From A Fabrication Layout For Correcting Proximity Effects," filed on Sep. 29, 2000, invented by Christophe Pierrat and Youping Zhang.

This application is related to U.S. patent application Ser. No. 09/676,356, entitled "Selection Of Evaluation Point Locations Based on Proximity Effects Model Amplitudes For Correcting Proximity Effects In A Fabrication Layout," filed on Sep. 29, 2000, invented by Christophe Pierrat and Youping Zhang.

This application is related to U.S. patent application Ser. No. 09/130,996, entitled "Visual Inspection and Verification System," filed on Aug. 7, 1998.

This application is related to U.S. patent application Ser. No. 09/153,783, entitled "Design Rule Checking System and Method," filed on Sep. 16, 1998.

This application is related to U.S. patent application Ser. No. 09/544,798, entitled "Method and Apparatus for a Network Based Mask Defect Printability Analysis System," filed on Apr. 7, 2000.

This application is related to U.S. patent application Ser. No. 09/154,415, entitled "Data Hierarchy Layout Correction and Verification Method and Apparatus," filed on Sep. 16, 1998.

This application is related to U.S. patent application Ser. No. 09/154,397, entitled "Method and Apparatus for Data Hierarchy Maintenance in a System for Mask Description," filed on Sep. 16, 1998.

This application is related to U.S. patent application Ser. No. 09/632,080, entitled "General Purpose Shape-Based Layout Processing Scheme for IC Layout Modifications," filed on Aug. 2, 2000.

BACKGROUND OF THE INVENTION

1. The Field of the Invention

This invention relates to the field of printed feature manufacturing, such as integrated circuit manufacturing. In particular, this invention relates to computing corrections using a proximity effects model at evaluation points to achieve improved agreement between a design layout and an actual printed feature.

2. Description of Related Art

To fabricate an integrated circuit (IC), engineers first use a logical electronic design automation (EDA) tool, also called a functional EDA tool, to create a schematic design, such as a schematic circuit design consisting of symbols representing individual devices coupled together to perform a certain function or set of functions. Such tools are available from CADENCE DESIGN SYSTEMS and from SYNOPSYS. The schematic design must be translated into a representation of the actual physical arrangement of materials upon completion, called a design layout. The design layout uses a physical EDA tool, such as those available from CADENCE and AVANT!. If materials must be arranged in multiple layers, as is typical for an IC, the design layout includes several design layers.

After the arrangement of materials by layer is designed, a fabrication process is used to actually form material on each layer. That process includes a photolithographic process using a mask having opaque and transparent regions that causes light to fall on photosensitive material in a desired pattern. After light is shined through the mask onto the photosensitive material, the light-sensitive material is subjected to a developing process to remove those portions exposed to light (or, alternatively, remove those portions not exposed to light). Etching, deposition, diffusion, or some other material altering process is then performed on the patterned layer until a particular material is formed with the desired pattern in the particular layer. The result of the process is some arrangement of material in each of one or more layers, here called printed features layers.

Because of the characteristics of light in photolithographic equipment, and because of the properties of the material altering processes employed, the pattern of transparent and opaque areas on the mask is not the same as the pattern of materials on the printed layer. A mask design process is used, therefore, after the physical EDA process and before the fabrication process, to generate one or more mask layouts that differ from the design layers. When formed into one or more masks and used in a set of photolithographic processes and material altering processes, these mask layouts produce a printed features layer as close as possible to the design layer.

The particular size of a feature that a design calls for is the feature's critical dimension. The resolution for the fabrication process corresponds to the minimum sized feature that the photolithographic process and the material processes can repeatably form on a substrate, such as a silicon wafer. As the critical dimensions of the features on the design layers become smaller and approach the resolution of the fabrication process, the consistency between the mask and the printed features layer is significantly reduced. Specifically, it is observed that differences in the pattern of printed features from the mask depend upon the size and shape of the features on the mask and the proximity of the features to one another on the mask. Such differences are called proximity effects.

Some causes of proximity effects are optical proximity effects, such as diffraction of light through the apertures of the optical systems and the patterns of circuits that resemble optical gratings. Optical proximity effects also include underexposure of concave corners (inside corners with interior angles greater than 180 degrees) and overexposure of convex corners (outside corners with interior angles less than 180 degrees), where the polygon represents opaque regions, and different exposures of small features compared to large features projected from the same mask. Other causes of proximity effects are non-optical proximity effects, such as sensitivity of feature size and shape to angle of attack from etching plasmas or deposition by sputtering during the material altering processes, which cause features to have shapes and sizes that have decayed from or accumulated onto their designed shapes and sizes.

In attempts to compensate for proximity effects, the mask layouts can be modified. A proximity effects model is often developed and used to predict the location of edges in the printed layer, given a mask layout.

A proximity effects model is typically built for a particular suite of equipment and equipment settings assembled to perform the fabrication process. The model is often built by performing the fabrication process one or a few times with test patterns on one or more mask layouts, observing the actual features printed (for example with a scanning electron micrograph), and fitting a set of equations or matrix transformations that most nearly reproduce the locations of edges of features actually printed as output when the test pattern is provided as input. The output of the proximity effects model is often expressed as an optical intensity. Other proximity effects models provide a calibrated output that includes a variable intensity threshold as well as optical intensity. Some proximity effects models provide a calibrated output that indicates a printed edge location relative to an intensity threshold value as a spatial deviation. Thus, some model outputs can take on one or more values that vary practically continuously between some minimum value and some maximum value.

Once a proximity effects model is produced, it can be used in the fabrication design process. For example, the proximity effects model is run with a proposed mask layout to produce a predicted printed features layer. The predicted printed features layer is compared to the design layer and the differences are analyzed. Based on the differences, modifications to the proposed mask layout are made.

In conventional systems, the distances between the predicted edges and the edges of the items on the design layout are used to correct the mask. For example, as shown in FIG. 1, the proximity model predicts that an original edge in the mask 110 aligned with a corresponding edge in the design layer, will result in a printed edge 120. The predicted printed edge 120 is displaced X units inward from the edge 110 as indicated by vector 132. For simplicity of illustration, the positions of the predicted printed features are shown on the same scale as the items in the design and fabrication layouts, both original and adjusted. The distance X units is measured on the common scale. The conventional system in this example modifies the mask layout by moving a segment corresponding to this edge 110 in the original mask layout outward, in the opposite direction, by a correction distance C equal to X distance units, as indicated by vector 134. The new edge in the adjusted mask is denoted by segment 114. In other conventional systems, not shown, the correction vector C has a magnitude given by a constant proportion of X.

FIG. 1 also shows that the difference between the predicted edge 120 and the original fabrication layout edge 110 is computed from an evaluation point 105 on a segment 112 of the edge 110. The segment 112 in the original fabrication layout is bounded by dissection points 102 and 104. The correction computed for the evaluation point 105, indicated by vector 134, is then applied to the whole segment 112, resulting in a new edge 114 for the adjusted mask layout. At least because of this change, the adjusted mask layout with edge 114 differs from the original fabrication layout with edge 110. The vertices 142 and 144 of the new edge 114 in the adjusted fabrication layout still correspond to the dissection points 102 and 104 on the original fabrication layout edge. After making these corrections to all segments in the proposed, original mask layout, a final, adjusted mask layout is generated that is used to form a mask used in the fabrication process.

A problem with the conventional technique is that changes in a printed features layer, such as a layer on a silicon wafer, may not be equivalent or linearly related to changes in position of an edge in a fabrication layout, such as a mask layout. As a consequence, a change in mask edge by X units, or proportional to X units, in general does not produce a movement of the printed feature edge 120 by X units, even when mapped at the same scale. The relationship between changes in the mask and changes in the printed features is often referred to as the Mask Error Factor (MEF) or the Mask Error Enhancement Function (MEEF). For integrated circuited, the MEEF is often computed as the partial derivative of the wafer dimension with respect to the mask dimension on the common scale.

The deviation of the MEEF from a constant value often prevents a mask corrected in the conventional way from fabricating printed features that meet the. spatial tolerance required by a manufacturing specification, i.e., the spec tolerance.

In this field, therefore, new ways are needed to compute corrections at evaluation points, that account for non-equivalence and non-linearity in the MEEF, so that the printed edges are guaranteed to lie within a spec tolerance of the design layer whenever such is possible for a given suite of fabrication equipment.

SUMMARY OF THE INVENTION

According to techniques of the present invention, an optimal bias is computed for a segment in a mask layout using a proximity effects model to account for non-equivalence and non-linearity between changes in mask layouts and changes in printed features. As used here, a bias is a measure of the distance between a segment of an edge in an adjusted fabrication layout, like a mask layout, from a corresponding edge in the original fabrication layout. The edge in the original fabrication layout corresponds to an edge in a design layout. The optimal bias is selected to give an adjusted mask layout that produces an edge in the printed features layer in closer agreement with a corresponding edge in the design layer than is available using conventional procedures.

In particular, in several embodiments, the proximity effects model is run for more than one value of bias, and the optimal bias is deduced from the output of these two or more model runs. Several embodiments of these techniques include elements that speed the computation of the proximity effects model and that select the two or more biases so that the computations can be applied over an entire layout iteratively, and still rapidly converge on optimal biases for the segments in the layout.

In other embodiments, an inverse proximity effects model is run. The positions of edges in segments in the design are input to the inverse model and amplitudes related to an edge in the fabrication layout are output at several locations. The optimal bias is deduced from the output of the inverse model.

In one aspect of these techniques, a technique of correcting for proximity effects a fabrication layout corresponding to an original fabrication layout for a printed features layer includes executing a proximity effects model to produce an initial output. The initial output is based on a first position for a segment in a fabrication layout. The first position is displaced from a corresponding original edge in the original fabrication layout by a distance equal to an initial bias. The model is also executed to produce a second output based on a second position for the segment. The second position is displaced from the corresponding original edge by a distance equal to a second bias. An optimal bias for the segment is determined based on the initial output and the second output. The segment is displaced in the fabrication layout from the corresponding edge based on the optimal bias.

In some embodiments of this aspect, the method further comprises determining a first correction based on the initial output associated with the initial bias. A second correction is determined based on the second output and associated with the second bias. Determining the optimal bias includes interpolating to a third bias associated with a target correction, and setting the optimal bias based on the third bias. Each correction is related to a difference between a first value of a property at a predicted printed edge and a second value of the property on the original edge.

In some embodiments of this aspect, executing the model and determining the optimal bias on the segment are repeated for a number of iterations until a termination criterion is satisfied.

In some of these embodiments, executing the model and determining the optimal bias on the segment are repeated for a plurality of segments in the fabrication layout during each iteration of the number of iterations.

In another aspect of these techniques, a technique of correcting for proximity effects a fabrication layout corresponding to an original fabrication layout for a printed features layer includes executing an inverse proximity effects model for a segment of an edge in the original fabrication layer. A correction is determined for the segment based on a difference between an output from the inverse proximity effects model and an initial position for the segment in the fabrication layout.

In another aspect of these techniques, a technique of correcting for proximity effects a fabrication layout corresponding to an original fabrication layout for a printed features layer includes building an inverse proximity effects model. The inverse proximity effects model is built using information from a test mask with a plurality of polygons of uniform light transmission properties and a printed features layer fabricated using the test mask. The inverse proximity effects model accepts as input positions of edges in the printed features layer and produces an output related to a position of an edge on the test mask. The inverse proximity effects model is executed for a segment of an edge in the original fabrication layer. A correction is determined for the segment based on a difference between an output from the inverse proximity effects model and an initial position for the segment in the fabrication layout.

In another aspect of these techniques, a technique for building an inverse proximity effects model includes using information from a test mask with a plurality of polygons of uniform light transmission properties and a printed features layer fabricated using the test mask. The inverse proximity effects model accepts as input positions of edges in the printed features layer and produces an output related to a position of an edge on the test mask.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF THE PREFERRED EMBODIMENT

Techniques are described for correcting fabrication layouts for proximity effects for the fabrication of printed features layers, such as in integrated circuits.

Functional Overview

Figure 2:
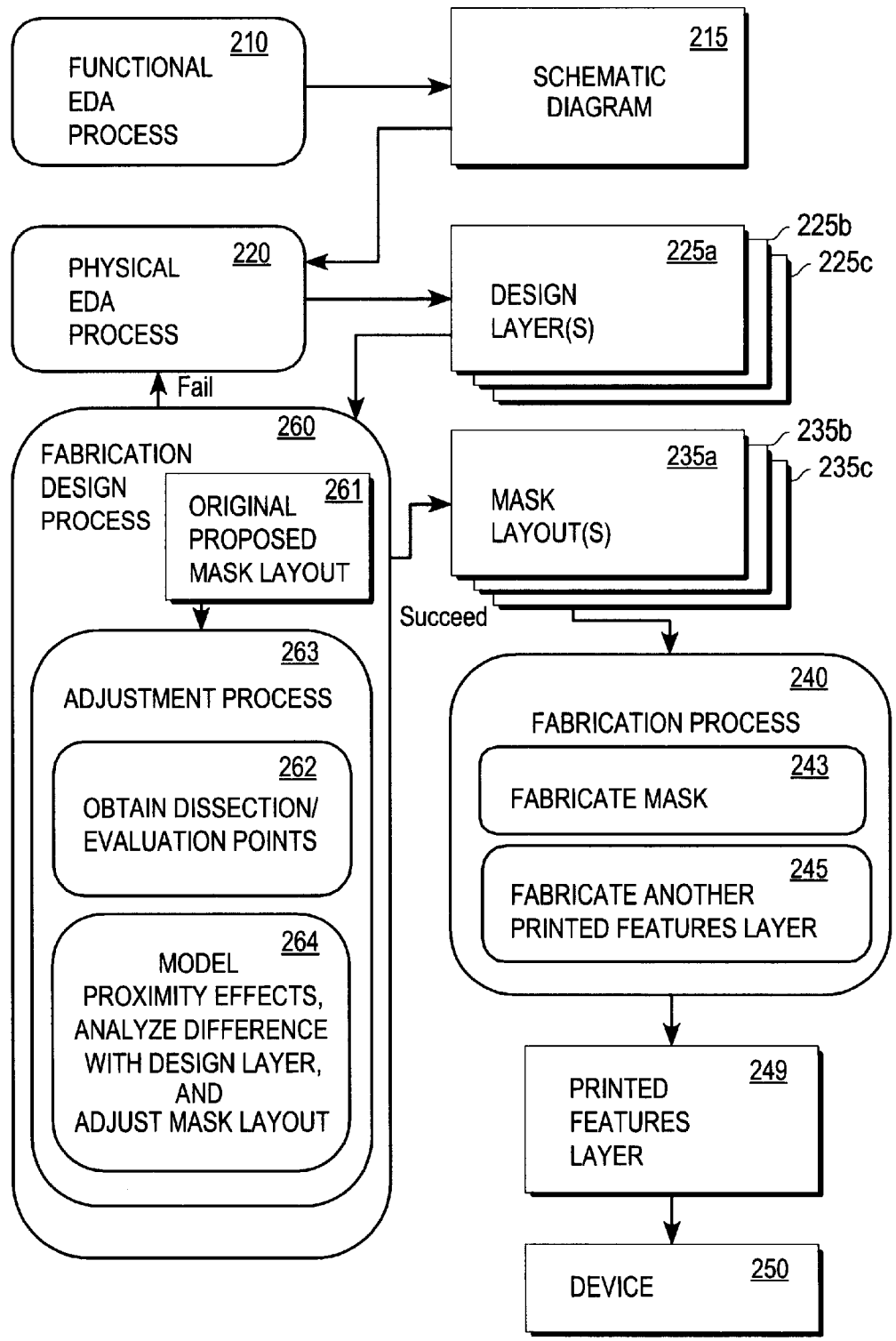
FIG. 2 is a flow diagram showing the relationship among sub processes in a printed features layer design and fabrication process, according to embodiments of the present invention.

FIG. 2 shows the processes and layouts produced according to the present techniques for designing and fabricating printed features layers 249. The conventional processes are modified to include new techniques for modeling proximity effects and adjusting a proposed mask layout, as represented in FIG. 2 by process 263.

The conventional processes include the Functional EDA process 210 that produces the schematic diagram 215. The physical EDA process 220 converts the schematic diagram to a design layout made up of one or more design layers 225. After mask layouts 235 are produced, the conventional processes employ a fabrication process 240 to produce the printed features layer 249 using the mask layouts 235. The printed features layer 249 may be a printed circuit or the mask used to produce the printed circuit. In the former case, the fabrication process includes one process 243 for forming the mask and a second process 245 to produce the layer of the integrated circuit using the mask. If the printed features layer is the mask, step 245 is skipped. The device 250, such as an integrated circuit, comprises one or more printed features layers.

According to techniques of the present invention, the fabrication design process 260 includes a new process 263 for modeling proximity effects and adjusting the fabrication layout.

The modeling is done at evaluation points using as input the distribution of polygons in a fabrication layout, such as the original proposed mask layout 261. Each evaluation point is placed on a segment of an edge on the original proposed layout 261 which corresponds to one of the design layers, e.g., 225a. A segment is defined by a pair of dissection points associated with the evaluation point on the edge in the original fabrication layout. The dissection points and evaluation points are selected in step 262 based on the polygons in the fabrication layout that are associated with the polygons in the design layout.

Figure 1:
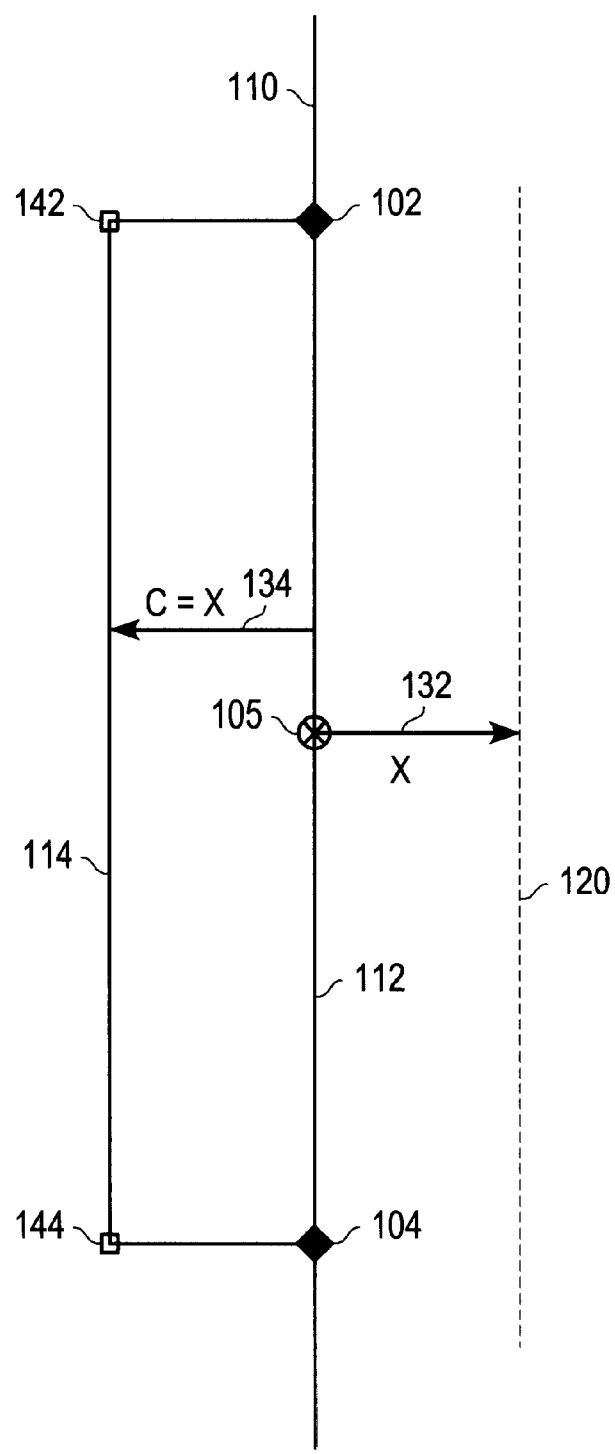
FIG. 1 is a plan view of an edge on a mask and the resulting edge of a printed features layer predicted by a proximity effects model, showing that the difference is used to correct the mask according to conventional methods.

In a preferred embodiment, the determination of dissection points and evaluation points on the fabrication layout proceed as described in the related applications, cited above. Each evaluation point and dissection point so determined is related to corresponding points in the original fabrication layout. For example, in FIG. 1, the dissection points 102 and 104 on edge 110 of the original fabrication layout correspond to the vertices 142 and 144, respectively, of the segment 114 in the adjusted fabrication layout.

The proximity effects are modeled in process 264. Based on an analysis of the model results and a comparison with the original fabrication layout corresponding to the design layer, as described in detail below, an optimal bias is computed in this process. The optimal bias is then applied to an entire segment in the original fabrication layout corresponding to the segment in the design layer to form a corresponding segment in the adjusted fabrication layout. The optimal bias value expresses the distance from the position of the segment in the original fabrication layout to the position of the corrected segment in the adjusted fabrication layout with a positive value for an outward adjustment. As a result of the adjustments, the polygons on the adjusted mask layout may differ from the polygons in the original proposed mask layout. The final mask layouts 235 are then based on the adjusted mask layouts produced by the adjustment process 263. In an iterative implementation, the result of the adjustment process becomes a new (non-original) proposed layout that is again subjected to the adjustment process until some termination criterion is satisfied.

Adjusting a Single Segment

To explain several embodiments of the process 264, it is first described in one embodiment in which it is applied with a conventional proximity effects model to a single segment after the dissection points and the evaluation points have been selected for the layout. In the embodiment described here, considerations of execution time are not included, so this embodiment is not limited in the number of points where the proximity effects model may be run. This embodiment is described with respect to FIGS. 3A, 3B and 3C.

In the following, the term amplitude refers to a scalar output from a proximity effects model. The term amplitude includes the optical intensity, the spatial deviation, the variable threshold, any other value output from the model, or any combination of these, such as a difference between an intensity and a variable intensity threshold, depending on the proximity effects model. In this terminology, an amplitude threshold is a value of the amplitude at a location where an edge is predicted to print.

Figure 3A:
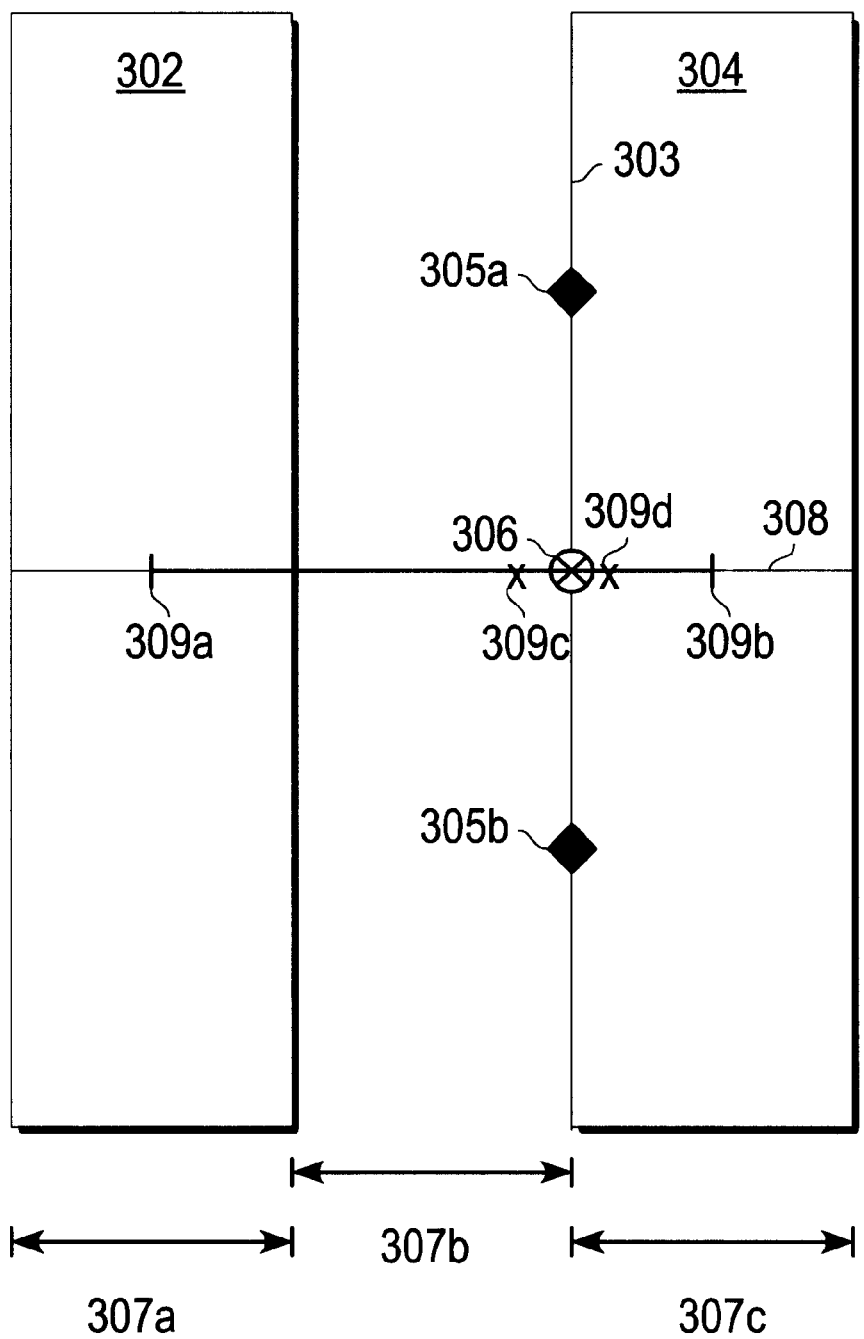
FIG. 3A is a plan view of a portion of a design layer showing orientation of a section for producing profiles of amplitude output by model runs.

FIG. 3A is a plan view of a portion of an original fabrication layout showing two opaque areas represented by polygons 302, 304. On the common scale used in this example, the arrows 307a, 307b and 307c represent a distance of 200 nanometers (nm). Polygon 304 has an edge 303 with a segment defined by dissection points 305a and 305b. On this segment is evaluation point 306. Section 308 intersects the segment at the evaluation point and is perpendicular to it. The amplitudes output by a proximity effects model are shown as profiles along section 308 from point 309a at 100 nm from the beginning of the section to point 309b at 500 nm from the beginning.

Figure 3B:
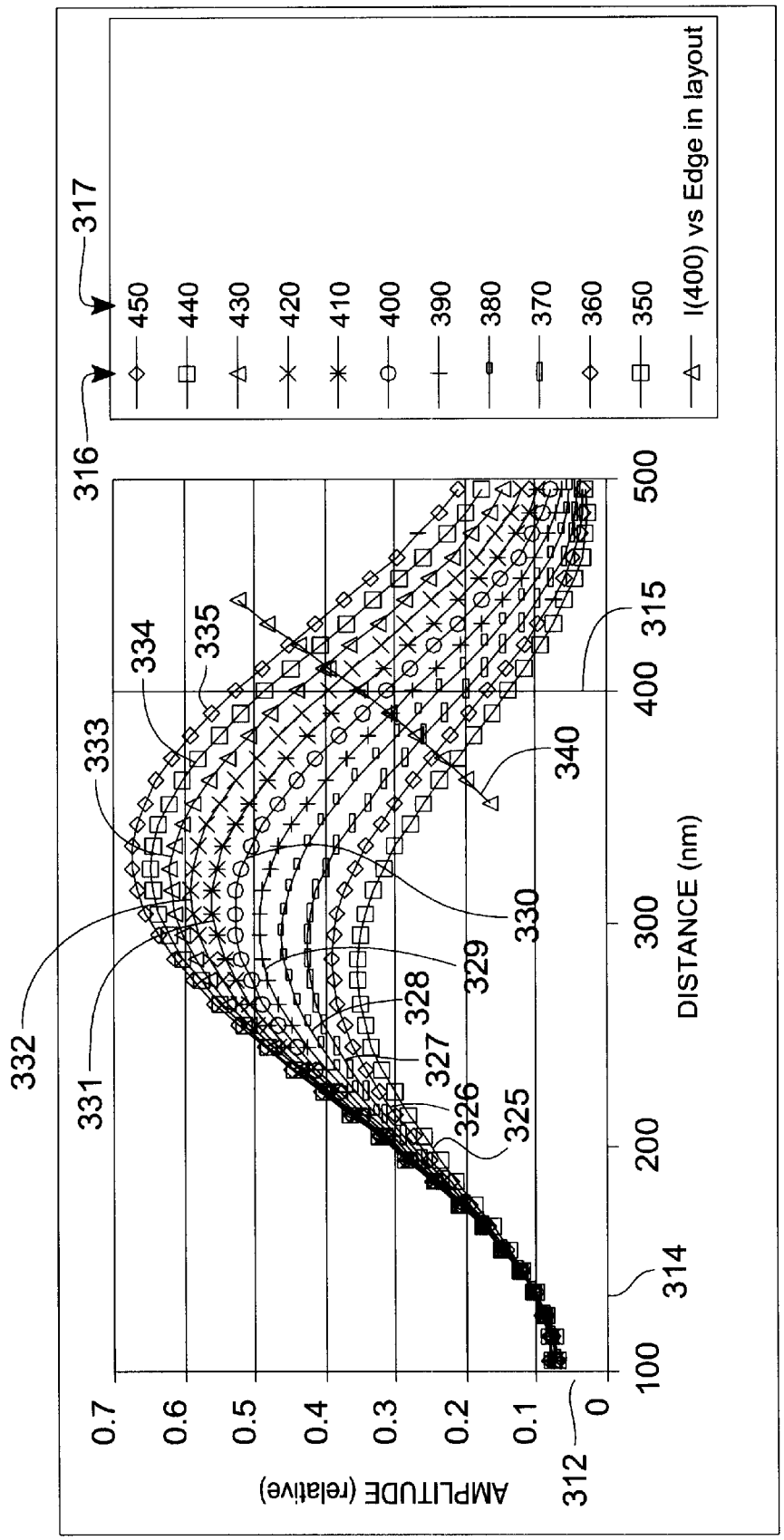
FIG. 3B is a graph plotting profiles along the section of FIG. 3A for several different values of bias.

FIG. 3B is a graph plotting profiles along section 308 from FIG. 3A for several different values of bias applied to the corresponding segment in the fabrication layout. The horizontal axis 314 gives the distance from the beginning of section 308. The vertical axis 312 gives the value of the amplitudes output by the proximity effects model. This graph plots 11 profiles of amplitudes output by a proximity effects model as curves 325 to 335.

Each profile represents the model output along section 308 for a different placement of the segment in an adjusted fabrication layout. The symbol in the curve is related to the placement of the segment according to the legend to the right of the graph. In the legend, the symbols are listed in column 316 and the associated placement of the segment in the fabrication layout is listed in column 317.

In this example, when the corresponding segment in the adjusted fabrication layout is placed at 400 nm, the segment coincides with the segment in the original fabrication layout, and the bias is zero. Thus curve 330 represents the profile output by the proximity effects model when the segment in the fabrication layout is at 400 nm; i.e., when the segment in the fabrication layout coincides with the original fabrication layout. In this description a negative bias refers to a displacement of a segment inside the corresponding edge in the original fabrication layout. In FIG. 3B a negative bias moves the segment to the right where the distance along section 308 increases. A positive bias refers to a displacement of a segment outside the corresponding edge, toward the left in FIG. 3B where the distance along section 308 decreases.

To illustrate this method and distinguish conventional methods, the model is described as if it is a calibrated model with variable intensity threshold. For this illustration, the amplitude is taken to represent the optical intensity. For purposes of illustration, the value of the variable intensity threshold is taken to be 0.4 amplitude units near the evaluation point, and the amplitude threshold is set equal to the variable intensity threshold. Similar results are obtained if the amplitude is defined as the difference between the intensity and the variable intensity threshold, and a constant amplitude threshold is taken to be zero, and the curves in FIG. 3B are modified accordingly.

Vertical line 315 marks the 400 nm distance where the segment lies in the original fabrication layout. Line 315 marks the nominal edge position, also called the target edge position for this segment. As can be seen from FIG. 3B, at a distance of 400 nm, curve 330 has a value substantially less than 0.4 amplitude units. Thus, the model predicts an edge is not printed at 400 nm in the printed features layer. Instead, the model predicts the edge is printed where the curve 330 crosses the horizontal line at 0.4 amplitude units. The curve 330 crosses the horizontal line of 0.4 amplitude units at 378.9 nm, a distance 21.1 nm to the left of the desired target edge location in FIG. 3B.

According to the conventional methods, a bias of −21.1 nm would be applied to move this segment in the fabrication layout to the right, i.e., to 421.1 nm. The hope is that moving the segment in the fabrication layout to the right by 21.1 nm will cause the edge in the printed layer to move to the right by the same amount. However, FIG. 3B. shows that if the segment in the adjusted fabrication layout is moved to 420 nm, the profile will follow curve 332, which has a value at 400 nm that is greater than 0.4 amplitude units. Thus moving the segment in the fabrication layout by even 20 nm is too far. The bias of −21.1 nm is too much because changes in the printed features layer are not equivalent to or linearly related to changes in the mask layout.

According to this embodiment of the present invention, the proximity effects model is run for several different experimental values of bias for the segment in the adjusted fabrication layout. For example, the proximity effects model can be run for eleven different experimental values of the bias, from an experimental bias of 50 nm represented by curve 325 to an experimental bias of −50 nm represented by curve 335. An estimate of the optimal bias for this segment is obtained by interpolating between two of the profiles that straddle the intensity threshold value of 0.4 amplitude units at the target edge location, 400 nm. As can be seen in FIG. 3B, curve 331 has a value at 400 nm that is less than the amplitude threshold value of 0.4 amplitude units; while the next profile, curve 332, has a value at 400 nm that is greater than the amplitude threshold value. In this example, an amplitude of 0.4 at 400 nm is 65 percent of the way from curve 331 to curve 332 at 400 nm. According to this embodiment, a bias corresponding to a segment position 65 percent of the way from 410 nm to 420 nm is selected as the optimal bias. That is, the optimal bias is −16.5 nm according to this embodiment.

Curve 340 in FIG. 3B plots the amplitude at a position of 400 nm, the nominal or target edge position, as a function of the position of the segment in the adjusted fabrication layout. Curve 340 intersects the amplitude threshold value of 0.4 amplitude units at 416.5 nm. The interpolating between profiles to the amplitude threshold value, described in the preceding paragraph, is equivalent to interpolating along curve 340 to the amplitude threshold value. In either case, applying a bias of −16.5 nm to the segment in the fabrication layout, rather than the −21.1 nm of the conventional methods, provides an edge in the printed features layer that is predicted to be closer to the target edge in the design layer, according to this proximity effects model.

For a calibrated model that uses a threshold and a spatial deviation, a curve (not shown) that plots spatial deviation at the evaluation point for several different experimental biases can be used in lieu of curve 340. Then the interpolation is carried out to find a bias that yields a spatial deviation of zero. The optimal bias is then based on this interpolated bias.

Figure 3C:
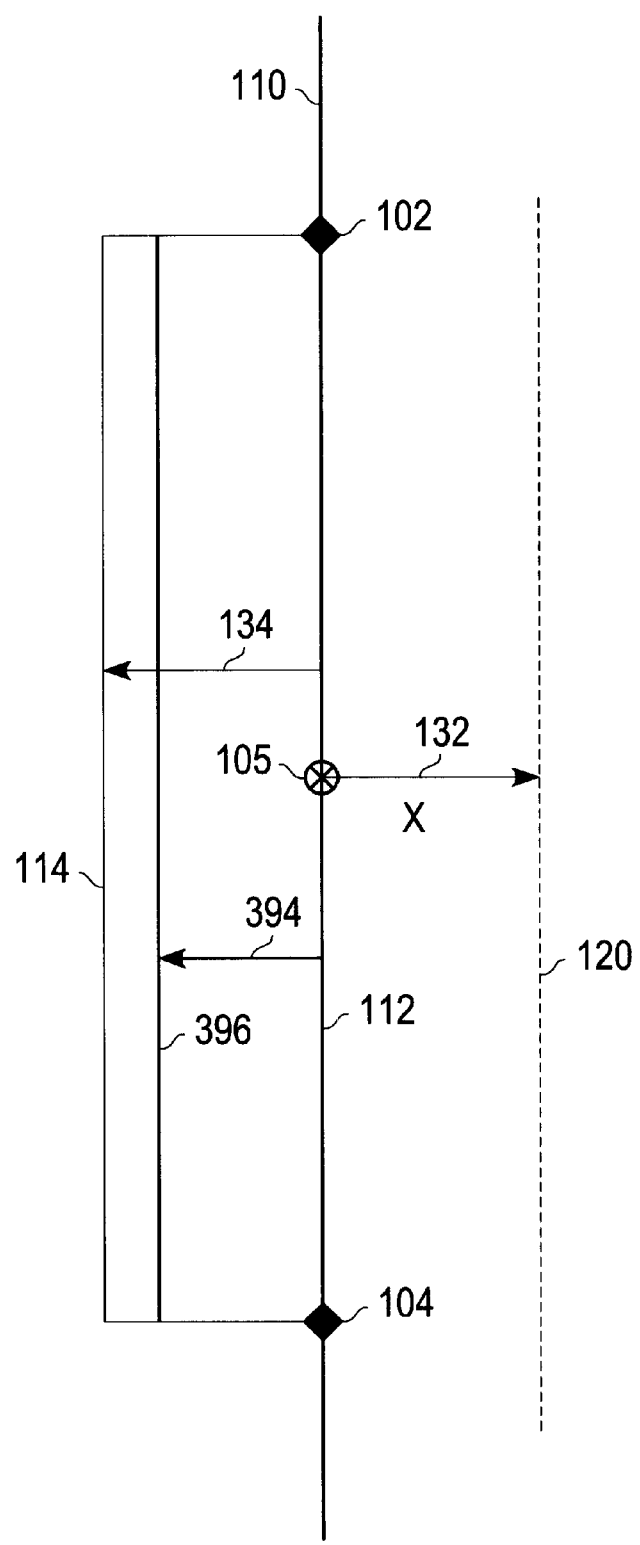
FIG. 3C is a plan view of an adjustment to a fabrication layout.

FIG. 3C shows the relationship between the optimal bias computed according to the present invention and the bias applied according to the conventional methods. Vector 132 connects the evaluation point 105 to the predicted printed edge 120 when no bias is applied. Vector 134 represents the bias according to the conventional methods. It is equal or proportional to vector 132 but in the opposite direction. For example, if vector 132 represents a distance of 21.1 nm to the left in FIG. 3B, then vector 134 represents a distance of 21.1 nm to the right, i.e., a bias of −21.1. In contrast, vector 394 represents the optimal bias applied to obtain adjusted segment 396 in the fabrication layout according to this embodiment of the present invention. The magnitude of vector 394 is different than the magnitude of vector 134. For example, as shown in FIG. 3C, vector 394 is smaller in magnitude than vector 132, with a magnitude of 16.5 nm rather than 21.1 nm. The optimal bias computed in this embodiment, and shown in FIG. 3C, accounts for the non-equivalence and non-linearity of the proximity effects captured by the proximity effects model. The conventional bias does not.

Reducing the Computational Load

The techniques of the present invention include embodiments that use fewer computational resources than used to produce several full profiles, such as graphed in FIG. 3B. There, 11 profiles were generated, one for each trial value of bias from −50 to +50 in increments of 10 nm. For each profile the model was run 41 times, one run for each location on section 308 from 100 to 500 nm in increments of 10 nm. Thus 451 model runs were required to produce FIG. 3B. It is not necessary to run the model that many times to practice the techniques of the present invention.

In one embodiment, each profile has a single value produced by running the proximity effects model at the evaluation point. Since the evaluation point is at the target position for the edge a curve for interpolation is generated directly. For example, curve 340 is produced simply by running the proximity effects model at the evaluation point for eleven experimental biases. Similarly, a plot of spatial deviation at the evaluation point can be produced by running that proximity effects model for the eleven experimental biases. The optimal bias is obtained by interpolating along the resulting curve to the amplitude threshold value, either the intensity threshold value or zero spatial deviation, respectively. Thus the curve to be interpolated can be produced with only 11 model runs. This amounts to a savings of 440 model runs.

In another embodiment, the model is run at the evaluation point only for two experimental values of the bias. For example, the two experimental biases are selected as zero and 20 nm, corresponding to a single value from each of the two profiles represented by curves 330 and 332. This embodiment then requires only 2 model runs, a savings of 449 model runs. However, if the two experimental biases are too far apart, or they do not straddle the amplitude threshold value, such as zero spatial deviation, then the optimal bias obtained by interpolation equations may not be very precise. If this embodiment is used, it is important to select the two experimental biases carefully so that the optimal bias is precise within a specification tolerance whenever possible. Details on selecting the experimental bias values for a particular embodiment are described in more detail below.

Other computational savings can be obtained if less then all the kernel functions in the proximity effects model can be used to produce the amplitudes, or if the proximity effects model can be run in consideration of only changes in the fabrication layout, or in consideration of only the nearest neighbors in the layout, or any combination of these savings. Techniques to realize these savings, as well as other advantages of the present invention, are illustrated with respect to a particular embodiment of the invention described below.

Example Embodiment With Proximity Effects Model

Figure 4A:
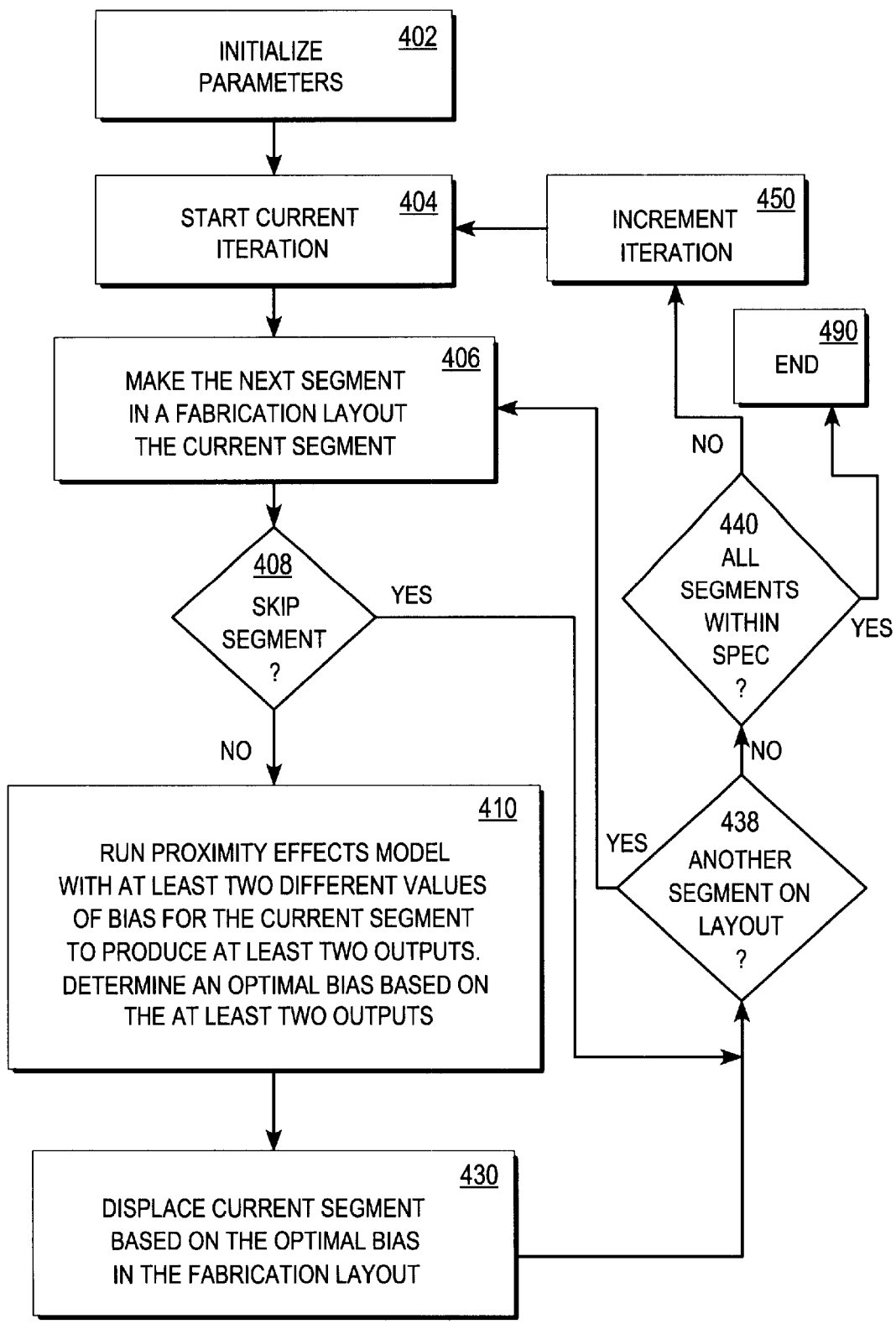
FIG. 4A is a flow diagram showing the iterative adjustment of a fabrication layout using a proximity effects model.

FIG. 4A is a flow diagram showing an iterative adjustment of a fabrication layout using a proximity effects model, according to one embodiment of adjustment process 263 from FIG. 2.

In step 402, parameters used by the techniques are initialized. More details on the parameters and their initialization are given below. In step 404, the current iteration begins. A segment of the fabrication layout is visited only once per iteration. More details on the steps included within step 404 are given below. In step 406, one of the segments not yet visited in this iteration is made the current segment. In step 408, it is determined whether the current segment should be skipped. If the current segment is skipped, control passes to step 438 to determine whether another segment remains to be visited in the layout. More details on the steps included within step 408 are given below. If the current segment is not skipped, control passes to step 410 in which the proximity effects model output is used for at least two different values of bias for the current segment. Typically, this involves executing once or twice a computer routine implementing the proximity effects model. Also in step 410, an optimal bias is determined based on the outputs from the two or more model outputs. Extensive details on the steps within step 410 are given below. In step 430, the layout is adjusted if necessary by moving the current segment to a position separated from the corresponding segment in the original fabrication layout by the optimal bias. More details on step 430 are given below.

After it is determined in step 438 that another segment remains to be visited within the layout, control passes back to step 406 to make the next segment the current segment. If it is determined in step 438, that no other segment remains to be visited, then control passes to step 440 to determine whether all segments in the layout require corrections less than the specification tolerance. If so, then no further changes to the biases are required, and the process ends in step 490. If at least one segment requires a correction greater than the specification tolerance, then control passes to step 450 to increment to the next iteration, and visit at least one of the segments again.

Initialization of Adjustment Parameters

Figure 4B:
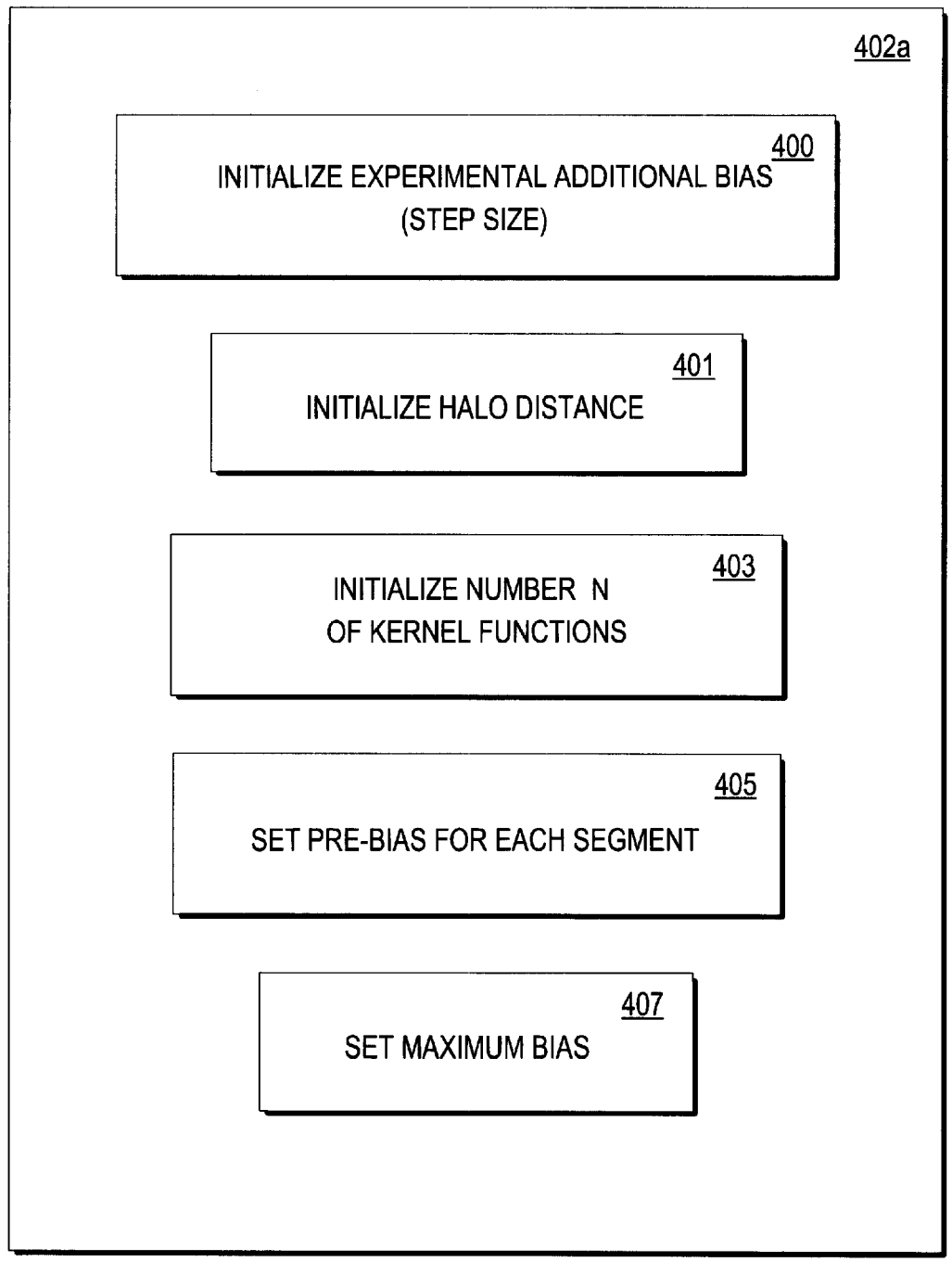
FIG. 4B is a flow diagram showing details of step 402 in FIG. 4A, according to one embodiment.

FIG. 4B is a flow diagram showing details for embodiment 402a of the initialize parameters step 402 in FIG. 4A.

In step 400, an initial value for the experimental additional bias is set. The experimental additional bias is a distance added to a first experimental bias to obtain a second experimental bias. The techniques of the present invention require at least two experimental biases for a segment in the fabrication layout, one of which could be zero, as explained above. As also explained above, the precision of the optimal bias obtained depends at least in part on the difference in the two experimental biases. The experimental additional bias parameter determines the difference in the two experimental biases. This parameter is also called the experimental bias step size.

In this embodiment, the experimental additional bias parameter is allowed to change with each iteration, so that step 400 sets a value for the first iteration, at least. In this embodiment, the experimental additional bias decreases from a maximum experimental additional bias on the first iteration toward a minimum experimental additional bias on subsequent iterations. In step 400, both the maximum experimental additional bias and the minimum experimental additional bias are set.

The experimental additional bias is allowed to change because, on the first iteration, the amount of correction required is expected to be greatest. Also, a large value of the experimental additional bias is desirable to increase the likelihood that the two experimental biases will produce predicted edges that straddle the target edge position. Straddling the target edge insures that the bias associated with the threshold value is obtained by an interpolation rather than an extrapolation computation. Although the mathematical formula for extrapolation is often the same as for interpolation, in general it is not desirable to perform an extrapolation computation because it can lead to uncontrolled behavior. For example, the extrapolated bias is not bounded by the two experimental biases, and can become arbitrarily large. Because other iterations will follow, it is not necessary that the first few iterations produce the most accurate value for the bias. It is more important that the first few iterations straddle the threshold value. To improve the precision during the later iterations, the experimental additional bias is decreased in the later iterations. The rate at which the experimental additional bias decreases with iteration is determined in this embodiment by a fading factor, f1, as is described in more detail below with respect to Equation 1. In this embodiment, a value for the fading factor value f1 is set during step 400.

In step 401, an initial value for the halo distance is set. The halo distance determines how far another feature in the fabrication layout may be from the evaluation point and still be used as input to the proximity effects model run at the evaluation point. In this embodiment, the halo distance is allowed to change based on iteration number. That is, the halo distance decreases from a maximum halo distance on the first iteration toward a minimum halo distance on subsequent iterations. In step 401, both the maximum halo distance and the minimum halo distance are set. The halo distance is allowed to decrease because the changes to the biases for the segments are expected to become smaller and fewer on later iterations. The smaller bias changes means that the segments are moving less on the later iterations. A smaller movement of a segment is likely to impact only other segments that are close by. Thus very little is added to the amplitude at a point by the more distant segments, when the segments have moved only a little. By decreasing the halo distance, fewer of the distant segments are involved in the computation. This decreases the computational effort to run the model without giving up significant precision. The rate at which the halo distance decreases with iteration is determined in this embodiment by a fading factor, f2, as is described in more detail below with respect to Equation 2. In this embodiment, a value for the fading factor value f2 is set during step 401.

In step 403, an initial value for the number of kernel functions used in running the proximity effects model is set. The number of kernel functions used determines the accuracy of the proximity effects model. The proximity effects model is built with a set of M kernel functions, where M is an integer. The number of kernel functions needed to achieve a given accuracy, such as the specification tolerance, is expected to decrease with each iteration because the geometries involved get smaller with each iteration. The geometries become smaller with each iteration because changes in segment biases get smaller with each iteration for the reasons given above. Also, the segments themselves may get smaller as new dissection points may be added to some segments on some iterations. As the geometries get smaller, the contributions of some kernel functions to the total model amplitude become negligible compared to the total. These kernel functions can be dropped. In this embodiment, a minimum number N of kernel functions is set for use after a large number of iterations, where N is an integer less than M. Decreasing the number of kernel functions used decreases the computational effort required to run the proximity effects model. The rate at which the number of kernel functions N decreases with iteration is determined in this embodiment by a fading factor, f3, as is described in more detail below with respect to Equation 3. In this embodiment, a value for the fading factor value f3 is set during step 403.

In step 405, a pre-bias is set for each segment. With a priori knowledge, a non-zero pre-bias can be used on at least some segments to get those segments closer to their ideal position before the first iteration. This reduces the number of iterations required to satisfy a termination criterion that depends on the changes in biases between successive iterations.

In step 407, a value for the maximum bias is set. The maximum bias is a limit placed on an optimal bias, so that the optimal bias never becomes larger than the maximum bias. The maximum bias can be set as a fixed value, or it can be set as a fixed fraction of the distance separating neighboring edges in the fabrication layout. For example, referring to FIG. 3A, the bias for segments on edge 303 of polygon 304 might reasonably be set to one third of the distance separating edge 303 and the closest edge of polygon 302. In this case the fixed fraction for the maximum is set to substantially ⅓. In one embodiment, a maximum for positive bias is set separately from another maximum for a negative bias during step 407.

Updating the Adjustment Parameters Each Iteration

Figure 4C:
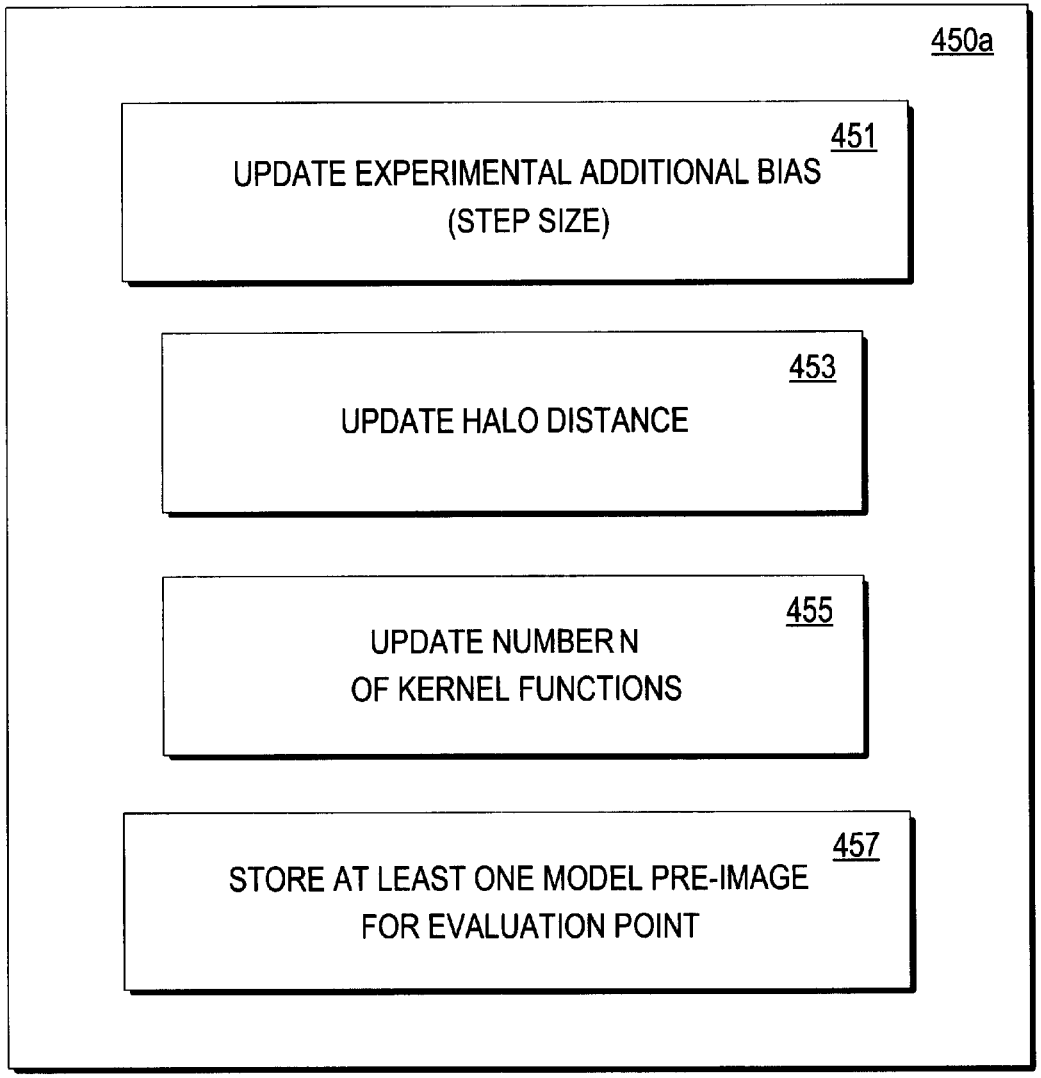
FIG. 4C is a flow diagram showing details of step 450 in FIG. 4A, according to an embodiment.

FIG. 4C is a flow diagram showing details of one embodiment of the increment iteration step 450 of FIG. 4A. In this embodiment 450a, the experimental additional bias, the halo distance, and the number N of kernel functions are updated in each iteration.

In step 451, the experimental additional bias is updated. Any method that changes the experimental additional bias can be used in other embodiments. In the preferred embodiments, the experimental additional bias is decreased in later iterations. According to one embodiment, the experimental additional bias is decreased as follows:

$$d_I = d_{min} + (d_{max} - d_{min})/f1^I \quad (1)$$

where I is the iteration number and begins with a value of zero, incrementing by one with each iteration; $d_I$ is the experimental additional bias on iteration I; $d_{min}$ is the minimum experimental additional bias; $d_{max}$ is the maximum experimental additional bias; and f1 is a first fading factor having a value no smaller than 1. A value for the first fading factor is chosen in order to control the speed with which the experimental additional bias decreases to the minimum experimental additional bias. The larger the first fading factor, the greater the speed with which the experimental additional bias decreases. In this embodiment, a value of f1 is set in step 400 of FIG. 4B.

In step 453, the halo distance is updated. Any method that changes the halo distance can be used in other embodiments. In the preferred embodiments, the halo distance is decreased in later iterations. According to one embodiment, the halo distance is decreased as follows:

$$h_I = h_{min} + (h_{max} - h_{min})/f2^I \quad (2)$$

where I is the iteration number; $h_I$ is the halo distance on iteration I; $h_{min}$ is the minimum halo distance; $h_{max}$ is the maximum halo distance; and f2 is a second fading factor having a value greater than 1. A value for the second fading factor is chosen in order to control the speed with which the halo distance decreases to the minimum halo distance. The larger the second fading factor, the greater the speed with which the halo distance decreases. In this embodiment, a value of f2 is set in step 401 of FIG. 4B.

In step 455, the number N of kernel functions is updated. Any method that changes the number N of kernel functions can be used in other embodiments. In the preferred embodiments, the number N of kernel functions is decreases based on iteration umber I. According to one embodiment, the number N of kernel functions is decreased as follows:

$$N_I = \text{INTEGER}[N_{min} + (M - N_{min})/f3^I] \quad (3)$$

where I is the iteration number; $N_I$ is the number N of kernel functions on iteration I; $N_{min}$ is the minimum number N of kernel functions; M is the maximum number of kernel functions; and f3 is a third fading factor having a value greater than 1. The third fading factor is chosen in order to control the speed with which the number N of kernel functions decreases to the minimum number N of kernel functions. The larger the third fading factor, the greater the speed with which the number N of kernel functions decreases. In this embodiment, a value of f3 is set in step 403 of FIG. 4B. INTEGER[ ] indicates an operation which converts a value inside the brackets to an integer value, such as the least greater integer or the greatest lesser integer. This operation is useful because an integer number of kernel functions must be used.

By the time control passes to step 450a, the first iteration has been completed and at least one segment has had the proximity effects model run in the vicinity of its evaluation point. If the model output includes a pre-image value, this pre-image associated with the evaluation point value is stored in step 457 in this embodiment. In many implementations of proximity effects models, an intensity is computed by first convolving the kernel functions with geometric characteristics of the edges in the fabrication layout relative to the evaluation point to produce a quantity called a pre-image. This portion of the process is linear and can be reused in different iterations and experimental biases. The pre-image values are used in a non-linear sum of squares to produce intensity. Since optical intensity on an two-dimensional array yields an optical black and white image, the value computed before intensity is a reasonably called a "pre-image" value. Characteristics of the intensity or pre-image or both are then used in a calibrated model to predict where the edge will print, for example, to compute either a variable threshold or a spatial deviation. In proximity effects models that provide a pre-image value, the pre-image value can be used to speed up the computation at the evaluation point on the next iteration or with the next experimental bias, as described in more detail below. In any case, if available, the pre-image associated with the evaluation point is stored in step 457 according to this embodiment. In embodiments in which one or more supplemental evaluation points are associated with the evaluation point, the pre-image is stored for the one or more supplemental evaluation points. Supplemental evaluation points are described in more detail below.

In another embodiment, new dissection points and evaluation points are determined on segments that have been displaced during the current iteration. For example, in FIG. 2, process 262 for obtaining dissection and evaluation points is repeated on every iteration of the adjustment process 263. In this case, for example, a displaced segment in the adjusted fabrication layout, like segment 196 in FIG. 3C, may be close enough to a vertex of another edge to warrant further dissection. The new dissection points (not shown) determined as if the edge were at the position of segment 396 are then associated with new dissection points (not shown) on the original fabrication layout edge 110 to define new segments (not shown) on that original edge 110.

Skipping Segments

Figure 4D:
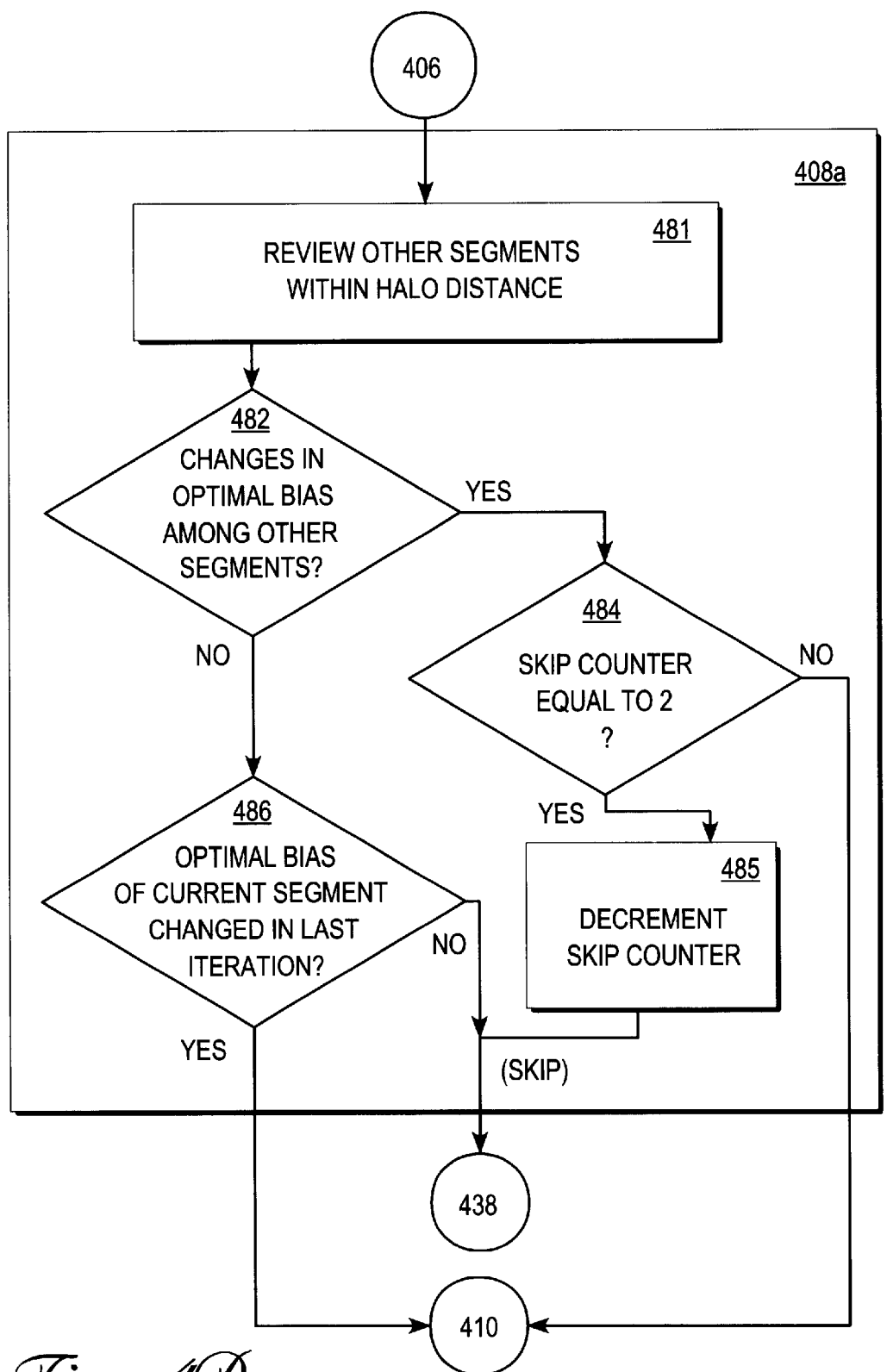
FIG. 4D is a flow diagram showing details of step 408 in FIG. 4A, according to an embodiment.

FIG. 4D is a flow diagram showing details for embodiment 408*a* of the skip segment step 408 in FIG. 4A. In step 481, other segments within the current halo distance are reviewed. During this step, information is obtained that indicates whether a particular segment has had its bias changed during the last iteration. In one embodiment this information takes the form of a stored value for an additional bias. The additional bias is described in more detail below. In another embodiment this information takes the form of a stored value of the last correction term computed. The correction term is described in more detail below.

In step 482, it is determined whether any of the other segments within the halo distance has had its bias changed in the last iteration. For example, it is determined whether any segment has a non-zero additional bias. If so, then the decision on whether the current segment is skipped or not depends upon whether the current segment was changed or skipped within either of the last two iterations.

If the current segment has not been changed or skipped in the last two iterations, then the skip counter will equal 2. In step 484, it is determined whether the skip counter is equal to 2. If so, then it is assumed unlikely that the smaller changes in the last iteration on the neighboring segments will have a noticeable effect on the current segment, and the current segment is skipped. Control passes to step 485, where the skip counter is set back to 1 so that this current segment is not skipped again in the next iteration. Therefore, if the segment is skipped in this iteration, it will not be skipped in the next iteration. In the next iteration the current segment will be visited again to determine whether its bias should be changed, as described in more detail below. If the current segment has not gone through two iterations without a change or a skip, the skip counter will be less than 2, and the segment will be processed in step 410 described below.

If none of the other segments within the halo distance has had its bias changed in the last iteration, as determined in step 482 above, then control passes to step 486. In step 486, it is determined whether the bias of the current segment was changed in the last iteration. If so, it is assumed that the bias still needs some fine-tuning and the segment will not be skipped. In this case, the segment will be processed in step 410 described below. If it is determined in step 486 that the current segment was not changed during the last iteration, then there is no reason to expect the current segment will need further tuning. In this case, the current segment is skipped and control passes to step 438 described in more detail below.

Computing Optimal Bias With the Proximity Efffects Model

Figure 4E:
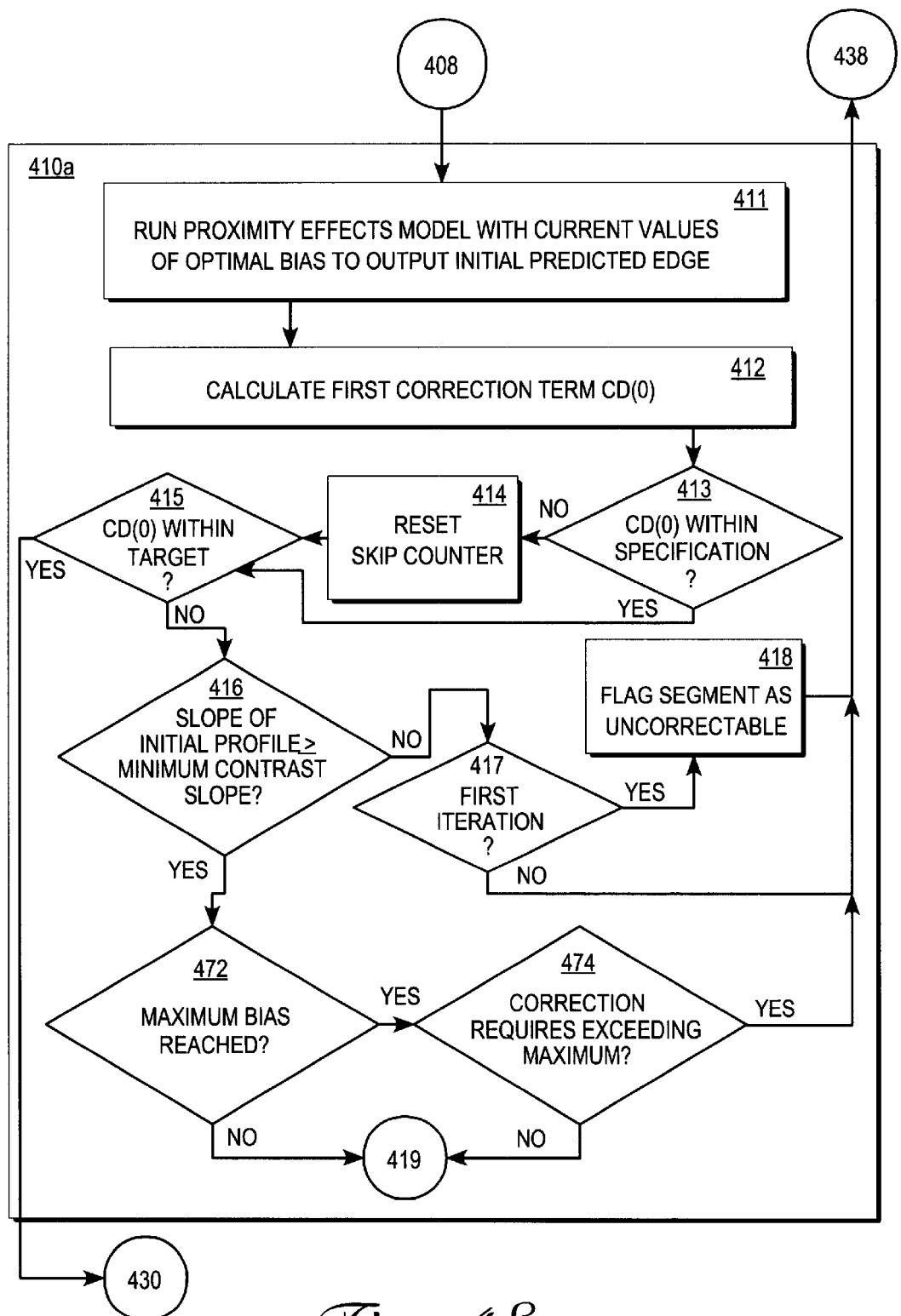
FIG. 4E is a flow diagram showing details of step 410 in FIG. 4A, according to an embodiment.
Figure 4F:
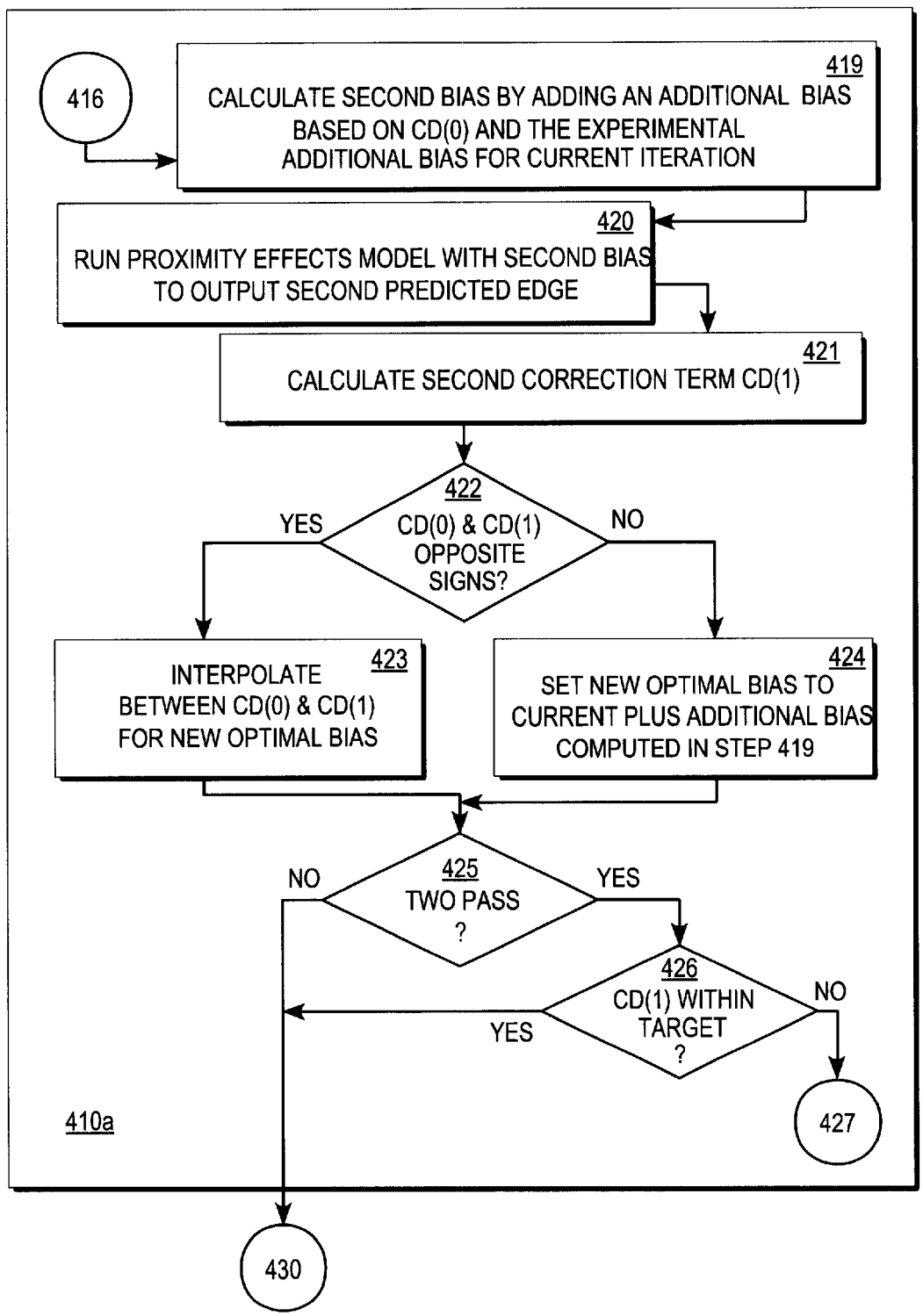
FIG. 4F is a flow diagram showing additional details of step 410 in FIG. 4A, according to an embodiment.
Figure 4G:
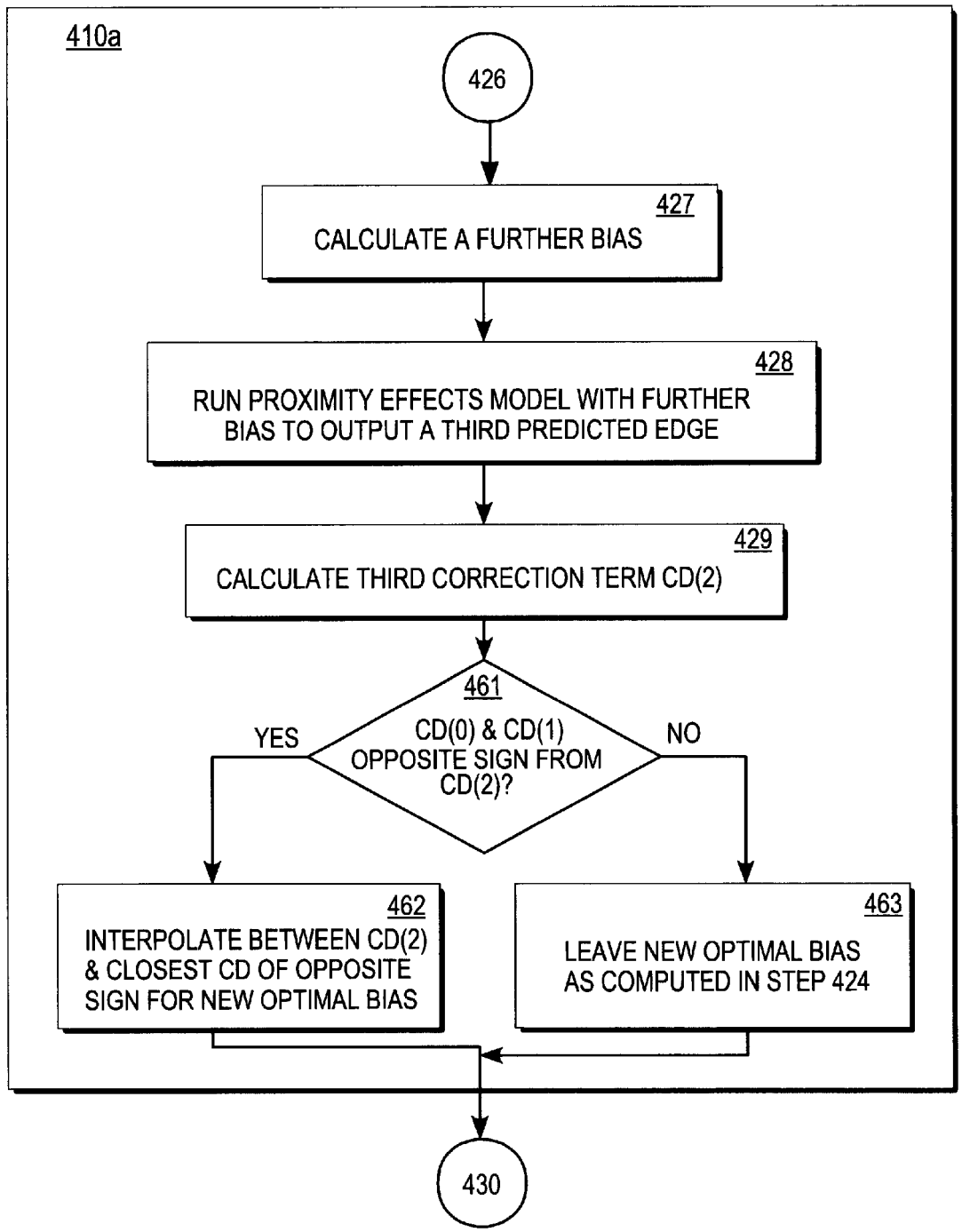
FIG. 4G is a flow diagram showing additional details of step 410 in FIG. 4A, according to an embodiment.

FIGS. 4E, 4F and 4G are flow diagrams showing details for embodiment 410*a* of the optimal bias determination step 410 in FIG. 4A for the current segment during one iteration.

Generating the Initial Profile of Model Amplitudes

In step 411, the proximity effects model is run for the current segment with the current value of the optimal bias. On the first iteration (I=0), the current value of the optimal bias is given by the pre-bias, if any, set in step 405 in FIG. 4B. Otherwise the optimal bias is zero on the first iteration. On subsequent iterations, the current value of the optimal bias is that computed on the previous iteration. In the following the current optimal bias is represented by $B_{I-1}$, to indicate the bias was computed on the previous iteration for the second iteration (I=1) and later. On the first iteration, where I=0, $B_{0-1}$ means the pre-bias, if any, or zero. Details of embodiment 411*a* of step 411 are shown in FIG. 5B. In embodiment 411*a*, the proximity effects model used provides a pre-image value as well as an amplitude and threshold.

In step 530, stored values for the current segment, comprising model pre-image values at the evaluation point or at any supplemental evaluation points or both, are retrieved. These stored values do not represent a segment displaced from the corresponding edge in the design layer by the current optimal bias, but, instead, represent a segment displaced by the optimal bias determined on the iteration before the previous iteration. On the first iteration, (I=0), there are no stored values of pre-image.

The supplemental evaluation points are points associated with the segment that are displaced from the evaluation point, usually perpendicularly to the segment. The supplemental evaluation points are used in some embodiments to compute the size and sign of experimental biases, as is described in more detail below. In the preferred embodiment, two supplemental evaluation points are used.

In step 532, changes to the bias associated with the current segment and with other segments within the halo distance are retrieved. On the first iteration, this stored change in bias is just the pre-bias, if any, set in step 405 in FIG. 4B. If no pre-bias was set in step 405 for this segment, then the change in bias is zero on the first iteration. On the second iteration (I=1), the change in bias is the optimal bias set on the first iteration (I=0). On subsequent iterations (I>1), this stored change in bias is the difference between the optimal bias computed during the previous iteration and the value of the optimal bias computed on the iteration preceding the previous iteration. In this embodiment, the halo distance used to select neighboring segments is the halo distance of the current iteration computed according to Equation 2 in step 450. During the first iteration, the halo distance is $h_{max}$.

In step 534, the kernel functions are convolved with the changes in bias determined in step 532 for the selected segments. The result is a computed change in pre-image at the evaluation point or supplemental points or both. Then the new pre-image value is obtained by adding the change to the stored pre-image value or values, if any, in step 536. A new value or values of intensity and, hence, new values of amplitude and printed edge position are then based on the new pre-image in step 538. In this embodiment, the number of kernel functions used is the number $N_I$ computed according to Equation 3 during step 450. During the first iteration, the number of kernel functions used is M.

The product of step 538 is the initial predicted edge of step 411 in FIG. 4E along with an initial profile of amplitudes at the evaluation point or at the supplemental evaluation points, if any, or both. By definition, the predicted edge resulting from running the proximity effects model at the supplemental evaluation points, if any, is substantially the same as the predicted edge resulting from running the proximity effects model at the evaluation point.

Using the Initial Profile of Model Amplitudes

In step 412, the initial predicted edge and the initial profile of model amplitudes are used to compute a first correction term CD(0) that is related to the distance between the predicted printed edge and the target edge. In one embodiment, if a calibrated model is used that provides a spatial deviation, that deviation is used as the first correction term CD(0). In another embodiment, the initial correction term, CD(0), is set equal to the conventional bias. In another embodiment, CD(0) is calculated using equations presented below, as shown in steps 514 through 518 in FIG. 5A. In other embodiments, other correction terms are used.

According to embodiment 412a, an estimated correction term CD is computed based on the difference between the amplitude at the evaluation point and the amplitude threshold value. Recall that the amplitude can be the spatial deviation, in which case the amplitude threshold is zero. Alternatively, the amplitude can be the intensity and the amplitude threshold is the constant or variable intensity threshold. Alternatively, the amplitude can be the difference between the intensity and the intensity threshold, in which case the amplitude threshold is a constant, zero. Any of these types of models can be used by embodiment 412a. For simplicity, the embodiment is described as if the amplitude, I, is optical intensity and the amplitude threshold, T, is the variable intensity threshold.

In embodiment 412a, the calculation of CD includes the slope of the amplitude profile at the evaluation point according to Equation 4, below. The correction term, CD, is computed as follows:

$$CD=(I_e-T)/s \qquad (4)$$

where $I_e$ is the amplitude at the evaluation point, T is the amplitude threshold value for that amplitude, and s is the slope of the amplitude profile at the evaluation point. Equation 4 is an estimate of the distance from the evaluation point to the point where the amplitude profile attains the value of the amplitude threshold. Equation 4 is a very good estimate when the evaluation point is in a portion of the profile that is near linear, or the threshold crossing point is nearby. Equation 4 is a poor estimate when the evaluation point is in a curved portion of the profile, or far from the point where the profile attains the value of the threshold. For example, in FIG. 3B, Equation 4 would be a poor estimate of the correction needed on curve 330 if the evaluation point were at 490 nm; but Equation 4 provides a substantially better estimate of the correction for the evaluation point in the more nearly linear portion of the profile near 400 nm.

Different embodiments utilize different steps to obtain a value of the amplitude at the evaluation point $I_e$. In one embodiment, $I_e$ is obtained directly by running the proximity effects model at the evaluation point.

In an alternative embodiment, two supplemental evaluation points are defined, and the proximity effects model is run at the two supplemental evaluation points. The first supplemental evaluation point is positioned inside the segment a distance $g_{inner}$ from the evaluation point and has an amplitude of $I_1$. The second supplemental evaluation point is positioned outside the segment a distance $g_{outer}$ from the evaluation point and has an amplitude of $I_2$. For example, in FIG. 3A, the first supplemental evaluation point is placed at point 309d and the second supplemental evaluation point is placed at point 309c. In this case, $I_e$ is computed using Equation 5a.

$$I_e=(I_1*g_{outer}+I_2*g_{inner})/(g_{inner}+g_{outer}) \qquad (5a)$$

In one embodiment, $g_{inner}$ is substantially equal to a specification tolerance for under-printing and $g_{outer}$ is substantially equal to a specification tolerance for over-printing. An advantage of this embodiment is that a clear indication is provided when the predicted edge is within tolerance of the original fabrication layout edge. That is, if the value of CD calculated according to Equation 4 lies in the range from $-g_{inner}$ to $g_{outer}$, then the predicted edge is within the specification tolerances for both over-printing and under-printing, without approximation.

Where the proximity model utilizes look-up tables to implement convolutions of the kernel functions, the entries in the look up tables often correspond to spatial locations of edges separated by a model grid distance. Therefore, in one embodiment, $g_{inner}$ and $g_{outer}$ are selected so the two supplemental evaluation points are spaced apart by the model grid distance. In some embodiments $g_{inner}$ and $g_{outer}$ are selected to be substantially equal.

Equation 5a can also be used with embodiments using the evaluation point with only one supplemental evaluation point outside the edge by setting $g_{inner}$ to zero and setting $g_{outer}$ to a non-zero positive distance and using the evaluation point amplitude for $I_1$. Similarly, Equation 5a can also be used with embodiments defining only one supplemental evaluation point inside the edge by setting $g_{outer}$ to zero and setting $g_{inner}$ to a non-zero positive distance and using the evaluation point amplitude for $I_2$. In either case, the non-zero positive distance is set substantially equal to the model grid distance in some embodiments.

To obtain a value of the slope, s, at the evaluation point in the embodiments using supplemental evaluation points, the model is run for each profile at the evaluation point and a supplemental evaluation point, or at two supplemental evaluation points. In either case, the slope is computed as follows:

$$s=(I_2-I_1)/(g_{inner}+g_{outer}) \qquad (5b)$$

Equation 5b is used with the evaluation point and a supplemental evaluation point outside the edge by setting $g_{inner}$ to zero and using the evaluation point amplitude for $I_1$. Equation 5b is used with the evaluation point and a supplemental evaluation point inside the edge by setting $g_{outer}$ to zero and using the evaluation point amplitude for $I_2$. The choice of inside or outside supplemental evaluation point depends on the attention to be paid to over-printing versus under-printing.

When the slope is computed according to Equation 5b, the sign of CD given by Equation 4 is a reliable indicator of the direction of a correction needed in a bias. For example, if this CD is positive, it means that the printed feature is printing too small, and that a positive correction to the bias is needed to compensate. For another example, in FIG. 3B, the supplemental evaluation point located outside the edge at a distance of about 390 nm, has a larger value of amplitude than the evaluation point. Consequently, the slope s will be positive, and the value of CD on curve 330 will be negative, because the amplitude at the evaluation point $I_e$ is less than the threshold value T being subtracted from it. This indicates the edge is printing too big. A negative change in the bias is indicated. A negative change in bias moves the edge in the fabrication layout inside the edge in the design layer. In FIG. 3B, this direction is toward the right. Consequently, the negative value of CD indicates the segment should be moved to the right of its position for curve 330.

Figure 5A:
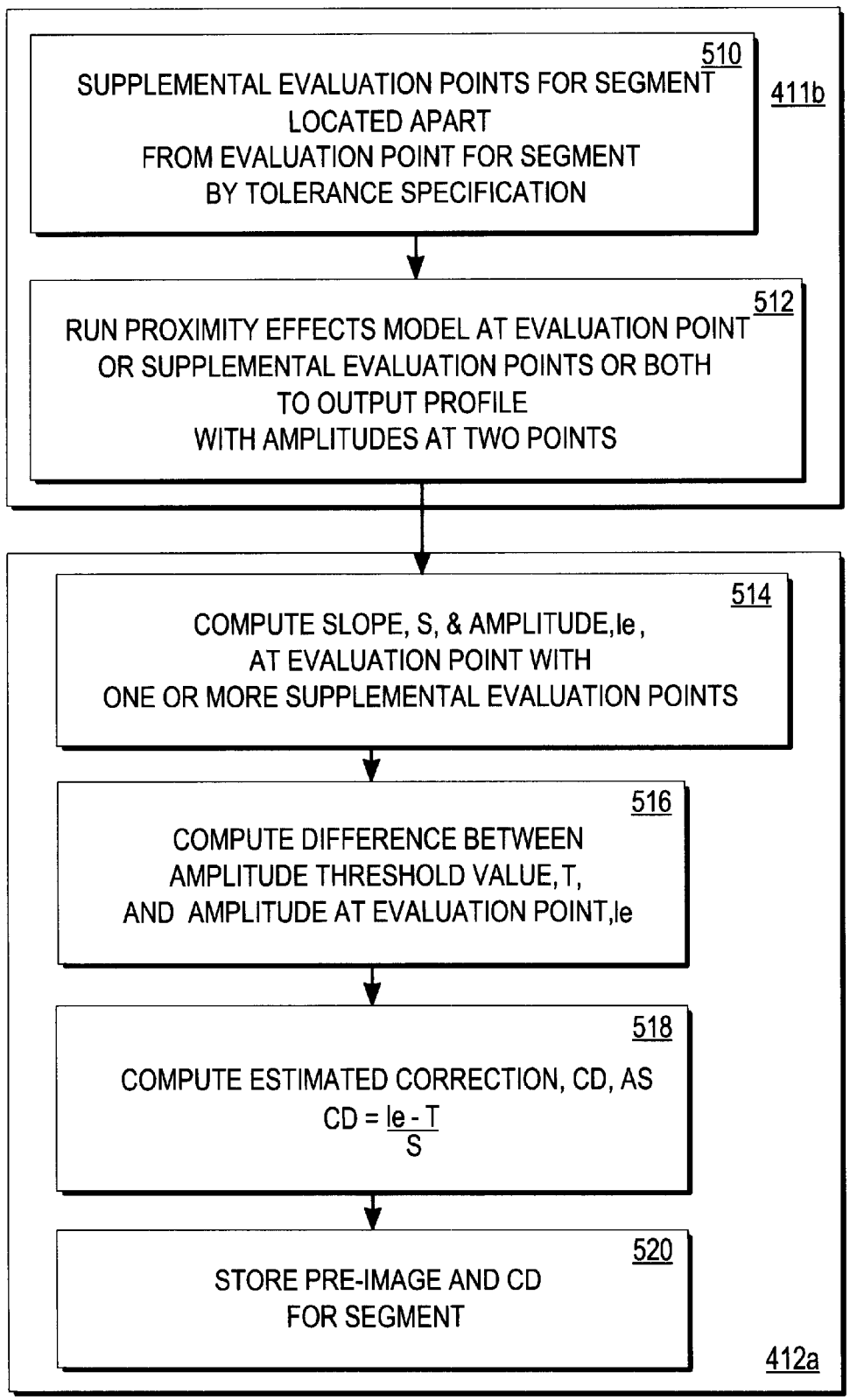
FIG. 5A is a flow diagram showing details of step 412 in FIG. 4B, according to an embodiment.
Figure 5B:
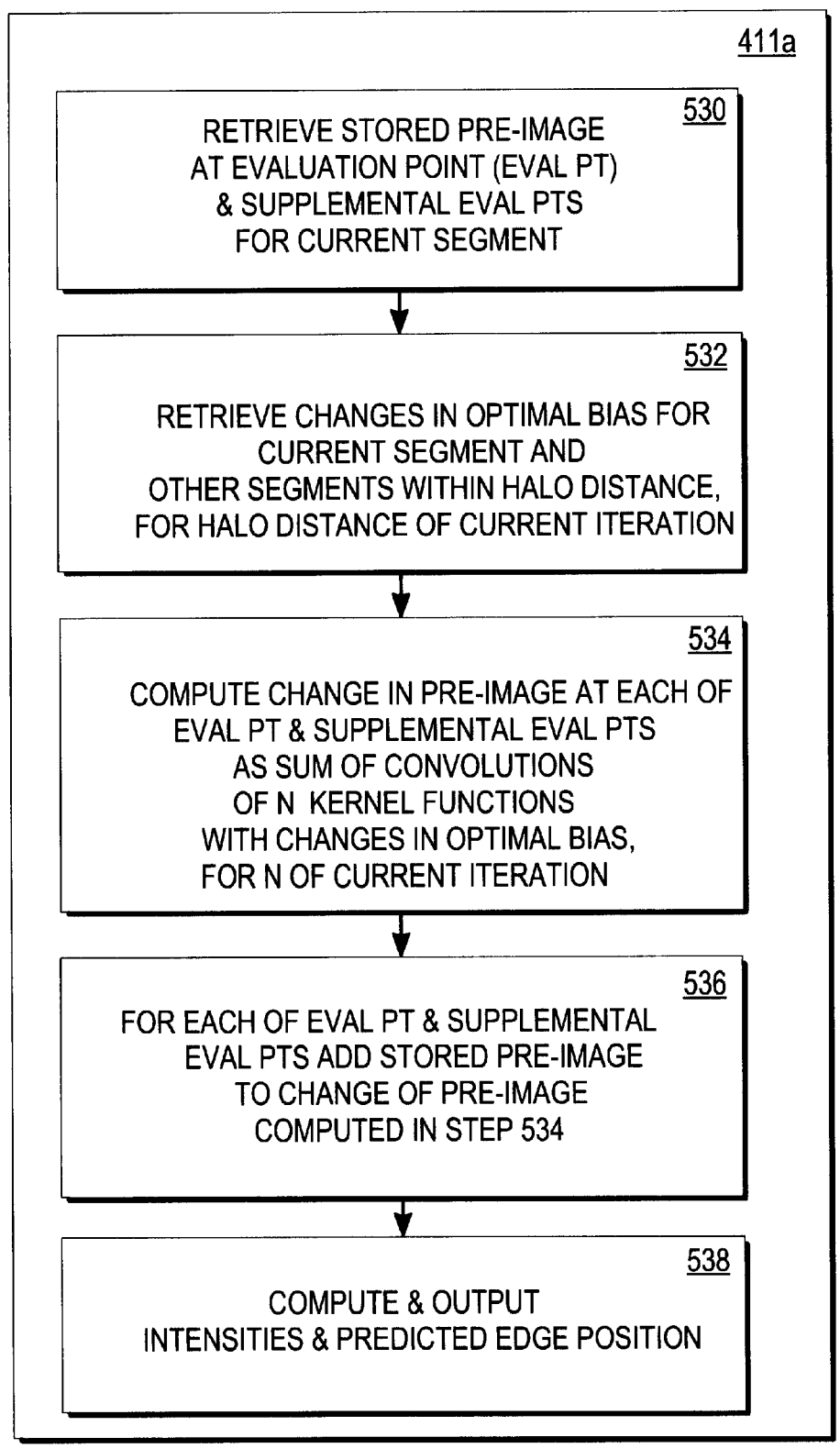
FIG. 5B is a flow diagram showing details of step 411 in FIG. 4E, according to an embodiment.

FIG. 5A shows more details of the techniques used in embodiments 411b and 412a of steps 411 and 412, respectively, to utilize Equations 1 and 2. In step 510, on the first iteration, two supplemental evaluation points for the current segment are defined, one inward from the evaluation point for the segment by a inner distance $g_{inner}$, and one outward from the evaluation point by an outer distance $g_{outer}$. In step 512, the proximity effects model is run at the two supplemental evaluation points for the current value of bias to output a predicted edge position and a profile with two amplitudes, one amplitude at each of the supplemental evaluation points. In other embodiments, the evaluation point is used in lieu of one of the supplemental evaluation points.

In step 514, the amplitudes at the supplemental evaluation points are used to compute the amplitude, $I_e$, at the evaluation point according to Equation 5a, and to compute the slope, s, according to Equation 5b. In other embodiments, the evaluation point is used in lieu of one of the supplemental evaluation points. In step 516, the difference is computed between the amplitude threshold value, T, and the amplitude at the evaluation point, $I_e$. In step 518, the correction term CD is computed according to Equation 4. In step 520, the pre-image values at the supplemental evaluation points are stored. Also stored, in this embodiment, is the value of the correction term CD.

The use of a pre-image saves computation time because the new contributions to the amplitude output by the model at the evaluation or supplemental evaluation points are computed only for the changes since the last iteration, and the resulting changes in pre-image values are simply added to the pre-image values already stored. During the first iteration, the pre-image is empty and the computation of amplitudes at evaluation points must include all geometries within the original layout. The resulting pre-images are stored. In the second iteration, only the contributions to pre-image from the biases are computed and added to the stored pre-image values. In the next and subsequent iterations, only the differences in biases, but not the biases themselves, are used to compute changes in the pre-image values near the evaluation points. As the number of segments that have their biases changed tends to decrease with later iterations, the new contributions to the pre-image also tend to decrease. Therefore the computational cost of adjusting the layout dramatically decreases.

In step 413, the first correction term CD(0) is compared to the specification tolerance. The correction term is considered an indication of the order of magnitude of the change needed in the current bias for the current segment. Thus, if the first correction term CD(0) is within the specification tolerance, then the bias for the current segment is converging on a value sufficiently precise to satisfy the specification requirements. If the first correction term CD(0) is not within the specification tolerance, then a significant change in the bias for the current segment is indicated. In this case, control passes to step 414 in which the skip counter is reset to 0. The skip counter is used to count the number of iterations that the current segment has not had significant changes in its bias and has not been skipped already. When control passes to step 414, a significant change in the bias of the current segment is expected, and therefore, the skip counter is reset.

If the first correction term CD(0) is within specification tolerance, then the current bias of the current segment is sufficiently precise to satisfy the specification, as stated above. When the values of the correction terms CD for all segments are within the specification tolerance, iterations are stopped. This is the termination criterion tested in step 440 of FIG. 4A as described above. However, in this embodiment, the bias for the current segment will still be adjusted unless the first correction term CD(0) is also within a target tolerance smaller than the specification tolerance. Requiring the current segment to have a correction term within the smaller target tolerance provides some margin to compensate for the proximity effects that couple changes in bias for each segment with the changes in bias of neighboring segments. Thus, if the first correction term CD(0) is within specification tolerance, then control passes to step 415 wherein it is determined whether the first correction term CD(0) is within the target tolerance. If CD(0) is also within target tolerance, then no further bias changes are necessary and control flows to step 430. Otherwise, control passes to step 416.

In step 416, the slope of the initial profile, determined using Equation 5b during the computation of the first correction term CD(0) in step 412, is tested. For the bias of the current segment to be considered correctable on this iteration, the slope must have large enough magnitude to attain the amplitude threshold value within a reasonable distance. The geometry of other features in the design layer limit how far an edge can be moved. If the magnitude of the slope is not large enough, the amplitude threshold value cannot be attained in the space provided. The slope at the nominal edge is a measure of the image contrast, especially when the amplitude is optical intensity.

In step 416, the slope is compared to a minimum contrast slope, $s_{min}$. If the magnitude of the slope exceeds or equals the minimum contrast slope, this segment is deemed correctable during this iteration and control passes to step 472.

If the magnitude of the slope is less than the minimum contrast slope, then the bias for the segment is not corrected during this iteration. If this happens in the first iteration, then the segment is considered uncorrectable during any iteration, and the segment is dropped to avoid any further visits. This reasoning is implemented in step 417, which determines whether the current iteration is the first iteration. If not, the segment is simply skipped and control passes to step 438. If it is the first iteration, control passes to step 418 where the segment is flagged as uncorrectable, and then control passes to step 438. A segment flagged as uncorrectable is not selected as the current segment during step 406 of FIG. 4A in later iterations.

If the edge is deemed correctable in step 416 because the slope is greater than the minimum slope, $s_{min}$, then control passes to step 472. In step 472 it is determined whether the current optimal bias equals or exceeds the corresponding maximum set for positive and negative biases during step 407 of FIG. 4B. If so, then control passes to step 474 to determine whether a correction on the order of CD would result in still exceeding the corresponding maximum. If so, then the segment is not corrected further and control passes to step 438 to check for the next segment.

If the current optimal bias does not equal or exceed the corresponding maximum, or if the correction tends to reduce the bias below the maximum, then control passes to step 419 in FIG. 4F to determine a second experimental bias at which to run the model.

Generating the Second Profile of Model Amplitudes

In step 419, a second bias is derived by adding to the current value of the optimal bias a first additional bias, d(0), that is a function of the first correction term, CD(0).

In one embodiment, the additional bias has the same sign as the first correction term CD(0), and has a magnitude of the experimental additional bias. In this embodiment, the experimental additional bias is a function of the iteration number, I, computed according to Equation 1 during step 450 in FIG. 4A. During the first iteration, with iteration number I equal to zero, the experimental additional bias is the maximum experimental additional bias. Therefore, in this embodiment, the first additional bias is given by the following equation:

$$d(0) = \text{sign}(CD(0)) * |d_I| \qquad (6a)$$

where the pair of vertical bars indicate the absolute value of the quantity between the bars. Recall that I is the iteration number.

In another embodiment, the additional bias is a function, fd, of the slope, s, and the correction term, CD. In this embodiment, a high contrast edge is defined as one having a slope greater than a predetermined value $s_{high}$. Then, if the slope, s, is greater than $s_{high}$, the additional bias is made proportional to the correction term, CD. The estimate of CD according to Equation 4 is a good indication of the expected change in bias when the edge has high contrast. On the other hand, when the contrast is lower than $s_{high}$, the value of CD is more sensitive to small changes in amplitude and may yield an additional bias that is too large, especially if the model has some noise near the target edge. An additional bias that is too small is preferable to an additional bias that is too large. For example, an additional bias that is too large may cause changes in neighboring edges that contaminate their biases for many iterations. So, when the slope, s, is greater than $s_{min}$ but less than $s_{high}$, the additional bias is made proportional to s rather than to CD. These relationships are captured by the following equation defining function fd:

$$fd(s, CD) = \begin{cases} k_1^* CD & \text{if } s \geq s_{high} \\ k_2^* s & \text{if } s_{high} > s \geq s_{min} \\ 0 & \text{if } s_{min} > s \end{cases} \quad (6b)$$

where $k_1$ and $k_2$ are preset constant coefficients. In an embodiment using Equation 6b, the constants $k_1$ and $k_2$ are set during step 400 of FIG. 4B. In this embodiment, then, the first additional bias is given by the following equation:

$$d(0)=fd(s, CD(0)) \quad (6c)$$

In a third embodiment, the additional bias is set equal to the correction term CD(0) unless this additional bias is too large. To ensure this choice does not yield an additional bias that is too large, the additional bias is selected as the minimum magnitude of the additional biases computed using CD(0), Equation 6a and Equation 6c. That is, in this embodiment, the first additional bias is given by the following equation:

$$d(0)=\text{sign}(CD(0))^*MIN[|d_I|, |f(s,CD(0))|] \quad (6d)$$

where MIN[ ] indicates an operation that selects the quantity having the smallest value of two or more quantities listed within the brackets and separated by commas.

The second experimental bias, D2, is then the sum of the optimal bias from the last iteration, $B_{I-1}$, stored as the "current" optimal bias, and the first additional bias d(0) as given by the following equation:

$$D2=B_{I-1}+d(0) \quad (6e)$$

In step 420, the proximity effects model is run for the segment displaced from the corresponding segment in the original fabrication layout by the second experimental bias, D2. The proximity effects model is run at the evaluation point or the supplemental evaluation points, if any, or both, to output a second printed edge position and two amplitudes that constitutes a second profile of model amplitudes. Details of running the proximity effects model are similar to those described in FIG. 5B for step 411. Control than passes to step 421.

Using the Second Profile of Model Amplitudes

In step 421, the second profile of model amplitudes is used to compute a second correction term CD(1) using Equation 4 and Equation 5a and Equation 5b (as shown in steps 514 through 518 in FIG. 5A).

In step 422, the signs of the first and second correction terms, CD(0) and CD(1), are compared. If the signs are different, then control passes to step 423 where an interpolation is performed, as described below. If the signs are the same, then extrapolation is indicated. In this case, control passes to step 424 where extrapolation is avoided by using the first additional bias d(0) computed in step 419 as the correction to the current optimal bias. Essentially, the first additional bias d(0) computed in step 419 is a maximum change in bias for this iteration. The new optimal bias for this iteration, $B_I$, is obtained by adding the first additional bias d(0) to the current optimal bias as was done in equation 6e, above. So, when extrapolation is indicated, the following equation used:

$$B_I=D2=B_{I-1}+d(0) \quad (7a)$$

In step 423, a linear interpolation is performed to obtain an optimal bias associated with a correction term equal to zero, where the amplitude at the evaluation point equals the threshold value. In this embodiment, the interpolated bias is a third bias computed as follows:

$$D3=B_{I-1}+d(0)^*CD(0)/(CD(0)-CD(1)) \quad (7b)$$

where CD(0) is the first correction term, CD(1) is the second correction term, d(0) is the first additional bias, and D3 is the third bias. The new optimal bias is based on D3. D3 is used as the new optimal bias if CD(0) and CD(1) have opposite signs, as shown in the following equation:

$$B_I=D3 \quad (7c)$$

In another embodiment, Equation 7b is also used in step 424 even if the two correction terms have the same sign and a maximum bias is set. Then, if the magnitude of D3 is less than the maximum bias, $D_{max}$, set in step 407 for a bias of the corresponding sign, the optimal bias is set to D3. Otherwise, the optimal bias is set to the maximum bias, $D_{max}$. This embodiment is given by the following equation:

$$B_I=\text{sign}(CD(0))^*MIN[|D3|, |D_{max}|] \quad (7d)$$

The Two-pass Option

After the new optimal bias, $B_I$, is determined in step 423 or 424, it can be used in step 430 to displace the current segment using a one-pass option. Using a two-pass option, a third profile and second interpolation is attempted before control is passed to step 430. Therefore, in the illustrated embodiment, control passes to step 425 to determine whether the two-pass option has been selected. If the two-pass option has not been selected, control passes to step 430.

If the two-pass option has been selected, control passes to step 426 to determine whether the second correction term CD(1) lies within the target tolerance. If so, there is little to be gained by computing the third profile and the second interpolation; so, control again passes to step 430. If the second correction term CD(1) does not lie within the target tolerance, then control passes to step 427 in FIG. 4G to continue with the two-pass option.

Generating the Third Profile of Model Amplitudes

In step 427 of FIG. 4G, a further experimental bias is calculated based on the newly computed optimal bias, $B_I$. In step 428, the proximity effects model is run for the segment displaced from the corresponding segment in the original fabrication layout by the further experimental bias. The proximity effects model is run at the evaluation point or the supplemental evaluation points or both to output a third predicted edge and the two amplitudes that constitutes a third profile of model amplitudes. Details of running the proximity effects model are similar to those described in FIG. 5B for step 411. Control than passes to step 429.

Using the Third Profile of Model Amplitudes

In step 429, the third profile of model amplitudes is used to compute a third correction term CD(2) using Equation 4 and Equation 5 (as shown in steps 514 through 518 in FIG. 5A).

In step 461, the sign of the third correction term CD(2) is compared to the signs of the first two correction terms, CD(0) and CD(1). If the signs are different, for example if either CD(0) or CD(1) has a different sign than CD(2), then a second interpolation is worthwhile. In this case, control passes to step 462 where a linear interpolation is performed between CD(2) and the closest correction term of opposite sign, to obtain the bias associated with a correction term of zero. If the signs are the same, then extrapolation is indicated. Control passes to step 463 where extrapolation is avoided by using the new optimal bias as computed in step 424. In this case, extrapolation was indicated in step 422 so that step 424 must have been performed. In either case, control passes to step 430 to displace the current segment by the new bias.

Displacing the Current Segment

Figure 4H:
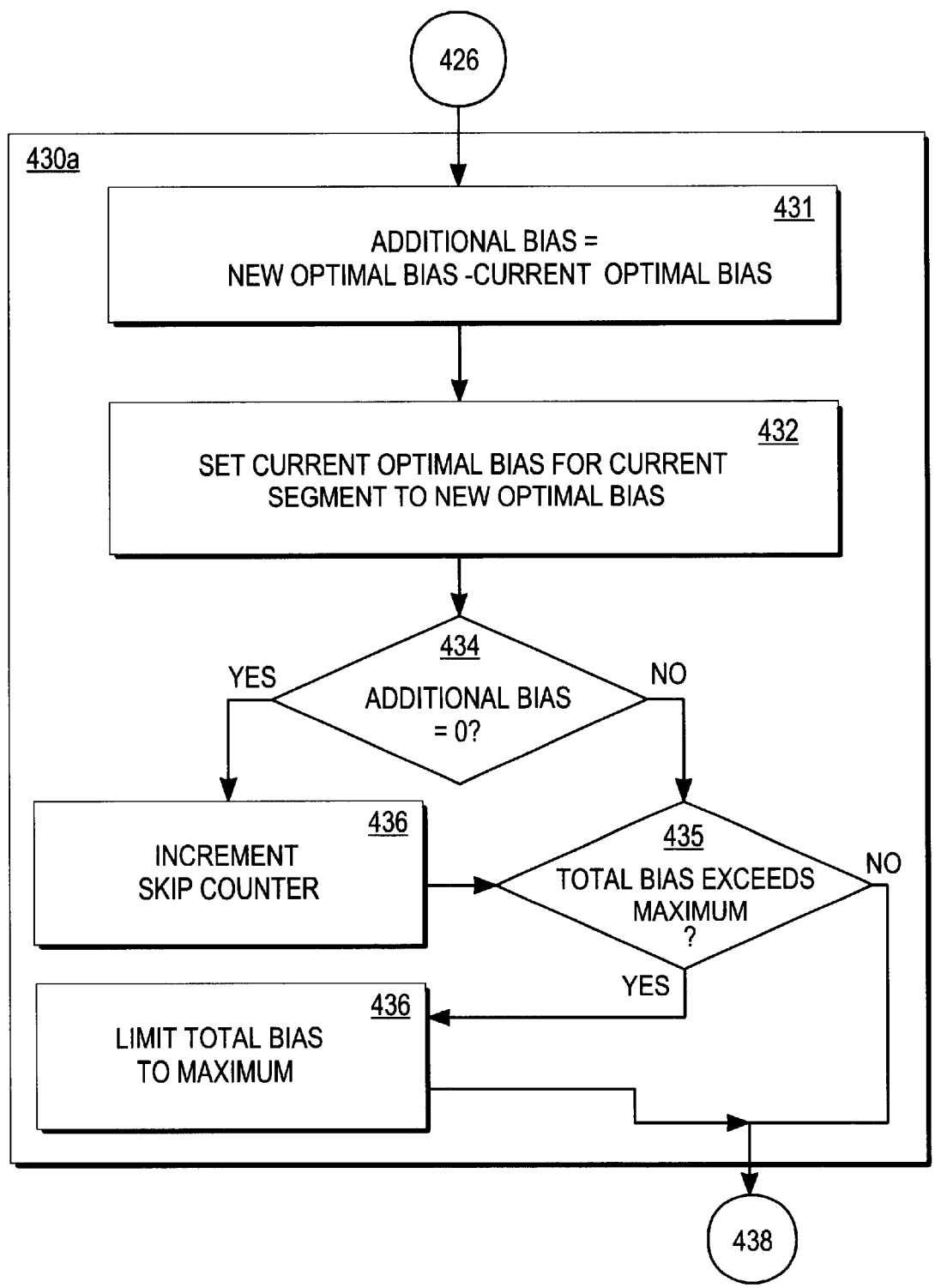
FIG. 4H is a flow diagram showing details of step 430 in FIG. 4A, according to an embodiment.

FIG. 4H is a flow diagram showing details for embodiment 430a of the displace segment step 430 in FIG. 4A. Step 431 denotes the relationship between the current optimal bias $B_{I-1}$, the additional bias $d_I$, and the new optimal bias, $B_I$. That relationship is indicated by the following equation:

$$d_I = B_I - B_{I-1} \quad (8)$$

Step 431 need not involve a subtraction if the first additional bias d(0) computed in step 419 or step 427 or both is used and is still available, such as in memory or on nonvolatile storage. In that case, $d_I$=d(0). In step 432, a computer variable $B_C$ holding the current optimal bias for the current segment is set equal to the new optimal bias, $B_I$. In step 434, it is determined whether the additional bias, $d_I$, marked in step 431 is equal to zero. If so, control passes to step 436 where a step counter is incremented. Incrementing the step counter indicates that the current segment did not have its bias changed during this iteration. That is, the additional bias $d_I$, denoted in step 431 was zero. When the skip counter reaches 2, the segment is skipped in the next iteration, during step 408 of FIG. 4A. In any case, control passes to step 435.

In step 435, it is determined whether the new optimal bias exceeds the corresponding maximum bias, $D_{max}$, for the same sign. If so, then, in step 326, the magnitude of the new optimal bias is set to the corresponding maximum, $D_{max}$, redefining $B_I$, and the additional bias, $d_I$ is recomputed using Equation 8.

In either case, control next passes to step 438 where the next segment in the layout is determined.

Replacing Stored Values

Only the latest values of optimal bias, pre-image, additional bias, and last computed correction term, CD, are stored at the end of each iteration. When the stored values are replaced, the steps that check neighboring segments for current bias and changes are presented with the replaced values. Thus time of replacement determines when corrections are felt by neighboring segments.

In some embodiments, the stored values of optimal bias, pre-image, additional bias, and last computed correction term, CD, are replaced during step 430 before going to the next segment. In other embodiments, the stored values are replaced after step 438 determines that there are no more segments in the layout to be visited on the current iteration. The timing of this replacement determines when corrections made on one segment are detected by other segments.

Separate Treatment of Corner Segments

In another embodiment, corner segments including only one vertex of an edge in the original fabrication layout, are treated differently than non-corner segments. The optimal bias computed for a corner segment is significantly reduced if all the non-corner segments on a polygon of the original fabrication layout are corrected with their optimal biases before computing and applying the bias for a corner segment.

Figure 9:
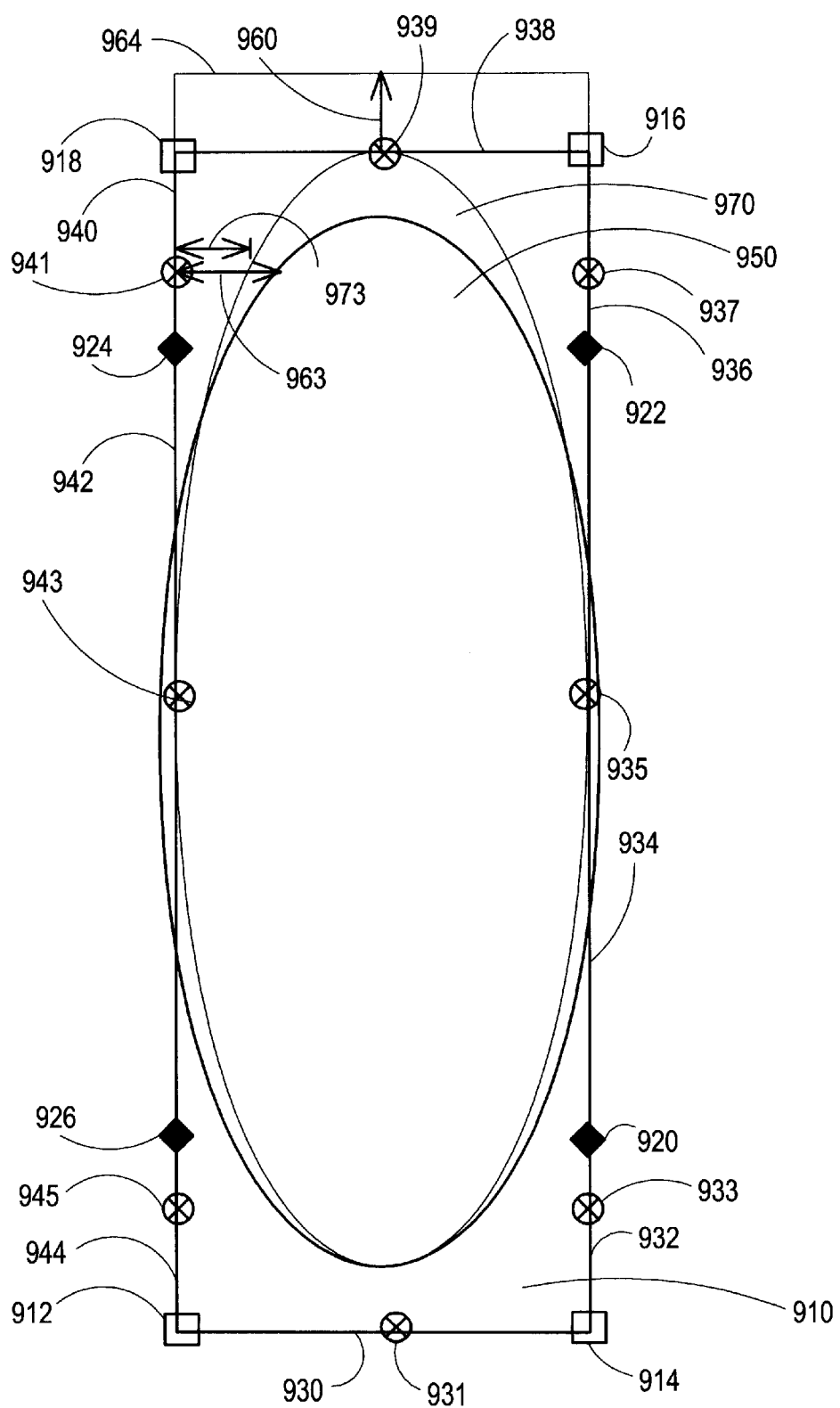
FIG. 9 is a plan view of an adjustment to corner segments in a fabrication layout.

For example, in FIG. 9, a polygon 910 in an original fabrication layout has four edges defined by vertices 912, 914, 916 and 918. The polygon has been dissected into eight segments with dissection points that include the four vertices as well as non-corner dissection points 920, 922, 924 and 926. Each of the resulting eight segments 930, 932, 934, 936, 938, 940, 942 and 944 has an evaluation point, 931, 933, 935, 937, 941, 943 and 945, respectively. The proximity effects model predicts the polygon 910 will print the elliptical feature 950. FIG. 9 depicts an optimal bias 960 computed for segment 938 at evaluation point 939 that moves that segment to position 964 in an adjusted fabrication layout after one iteration. According to some embodiments, the bias computed for corner segment 940 including vertex 918 with evaluation point 941 will be based on a correction term CD proportional to the distance marked by arrow 963.

According to another embodiment, a corner segment having one vertex, like corner segment 940, does not have its bias determined until after all the non-corner segments have had their biases determined and applied. Segment 938 has two vertices and therefore is a line end segment, not a corner segment, according to this definition of a corner segment. Therefore the bias 960 computed for segment 938 is applied before computing a bias for corner segment 940. Segments 930, 934 and 942 are also non-corner segments. To illustrate the effect of treating corner segments separately, it is assumed that a negative bias (not shown) is computed for non-corner segments 934 and 942 as well as the positive bias 960 computed for segment 938. After these biases are applied to the corresponding segments, the proximity effects model predicts the different elliptical feature 970 will be printed. If the corner segment 940 is now treated to determine a bias at evaluation point 941, it will be based on a correction term having a size illustrated by arrow 973. As can be seen, the correction term 973 for the corner segment computed in this way is substantially smaller than the correction term 963 computed in the alternative embodiment. Thus, the fabrication layout can be adjusted using less severe biases in corner segments.

According to one embodiment for treating corner segments separately, in step 406 of FIG. 4A, the next segment selected will be only non-corner segments on one iteration and only corner segments on the next iteration. In this embodiment, each current bias ($B_C$), pre-image values at the evaluation point or supplemental evaluation points or both, correction term (CD), and additional bias (d), replaces the stored values of those quantities for the segment in step 440 in some embodiments, and in step 450 in other embodiments.

According to another embodiment for treating corner segments separately, in step 406 of FIG. 4A, the next segment is chosen so that all non-corner segments of a polygon are visited before any corner segment of the polygon. In this embodiment, each bias, pre-image, correction term and additional bias replaces the stored values of those quantities for the segment when there are no more non-corner segments on the polygon, and the next segment on the polygon is a corner segment. This check and replacement is made in step 438 in some embodiments, in step 406 in other embodiments.

Correction Damping

Applying a bias that is too large to one segment can adversely impact other segments. This impact is not considered during the iteration in which the correction is made because the neighboring segments are corrected based on the stored prior value of the bias which is usually not updated until the end of the iteration. On the next iteration the affected segments sometimes have to be overcorrected to offset the impact. This results in oscillating over-corrections that can seriously impair convergence of the adjusted fabrication layout to a stable solution. This undetected coupling is particularly strong in the first few iterations where the additional experimental bias, $d_I$, is large (see Equation 1). To reduce the effects of undetected coupling between neighboring segments, the computed correction is damped by multiplying by a damping factor $\rho$ less than or equal to one.

In one embodiment, the damping factor increases from a value of $\rho_0$ toward a value of 1.0 as the iteration number I increases. The change of damping factor $\rho$ with iteration is given by the following equation:

$$\rho_I = 1 - (1-\rho_0)/f4^I \quad (9a)$$

where I is the iteration number; $\rho_I$ is the damping factor on iteration I; $\rho_0$ is the minimum damping factor; and f4 is a fourth fading factor having a value greater than 1. A value for the fourth fading factor is chosen in order to control the speed with which the damping factor increases to a value of 1.0. The larger the fourth fading factor, the greater the speed with which the damping factor increases. In this embodiment, values for $\rho_0$ and f4 are set in step 402 of FIG. 4A.

Whenever a bias is computed using interpolation, the calculated bias is reduced based on the damping factor according to the following equation:

$$B_I = \rho_I * D3 \quad (9b)$$

where $B_I$ is the new optimal bias for the current iteration and D3 is the third bias obtained via interpolation as given in Equation 7b. According to this embodiment, Equation 9b is substituted for Equation 7c in steps 423 and 462.

In another embodiment, correction damping is achieved by interpolating to a bias associated with a CD value other than zero. In Equation 7b above, a value for a third bias D3 is computed by interpolating the additional bias between CD(0) and CD(1) to where CD equals zero. If there is concern that the optimal bias computed based on this D3 is too large, then a smaller D3 can be obtained by interpolating to a target value of CD closer to CD(0) than zero is to CD(0). This new target CD is defined by a second damping factor $\gamma$. That is, the new target CD for the interpolation is equal to the quantity $\gamma*$ CD(0) rather than 0.0.

In one embodiment, the second damping factor decreases from a value of $\gamma_0$, less than one, toward a value of 0.0 as the iteration number I increases. The change of damping factor $\gamma$ with iteration is given by the following equation:

$$\gamma_I = (\gamma_0)/f5^I \quad (10a)$$

where I is the iteration number; $\gamma_I$ is the second damping factor on iteration I; $\gamma_0$, less than 1.0, is the maximum second damping factor; and f5 is a fifth fading factor having a value greater than 1. A value for the fifth fading factor is chosen in order to control the speed with which the second damping factor decreases to a value of 0.0. The larger the fifth fading factor, the greater the speed with which the damping factor decreases. In this embodiment, values for $\gamma_0$ and f5 are set in step 402 of FIG. 4A.

According to this embodiment, the interpolation described by Equation 7b is replaced by the following interpolation equation:

$$D3 = B_{I-1} + d(0)*(1-\gamma_I)*CD(0)/(CD(0)-CD(1)) \quad (10b)$$

where the terms other than $\gamma_I$ are as described above with respect to Equation 7b. As the iteration number I increases and $\gamma_I$ decreases to 0.0, Equation 10b approaches Equation 7b.

Considering Neighboring Segment Bias Changes

In many of the above embodiments, estimates of bias changes in neighboring segments are not considered until after the stored values are updated at the end of each iteration. As mentioned above, this leads to a failure to account for coupling and can cause overly large bias changes that hamper convergence to a stable adjusted fabrication layout.

According to another set of embodiments, estimates of changes in neighboring segments are considered. In these embodiments, steps 411 and 412 of FIG. 4E and step 419 of FIG. 4F are performed not just for the current segment but also for one or more segments closest to the current segment. In one embodiment, the non-corner segments on either side of the current segment and from the same edge as the current segment are considered together with the current segment. This way, the second predicted edge produced during step 420 for the current segment includes some of the coupling effects resulting from estimated changes in bias applied to the neighboring segments in step 419. After step 419, the second correction term CD(1) computed in step 421 and the new optimal bias computed in step 423 need only be performed for the current segment in this embodiment.

Using these embodiments, when one segment is corrected, the potential changes in the environment of the segment are being taken into account. Thus some of the coupling is expected to be captured in the new optimal bias. By capturing more of the coupling in each iteration, the total number of iterations to achieve the tolerance specification is expected to decrease. Thus these embodiments are expected to speed the convergence to an optimal adjusted fabrication layout.

An Inverse Proximity Effects Model

In another aspect of the present invention, the conventional proximity effects model is not used. Instead, an inverse proximity effects model is built and utilized to determine a bias for a segment in a fabrication layout.

Figure 6:
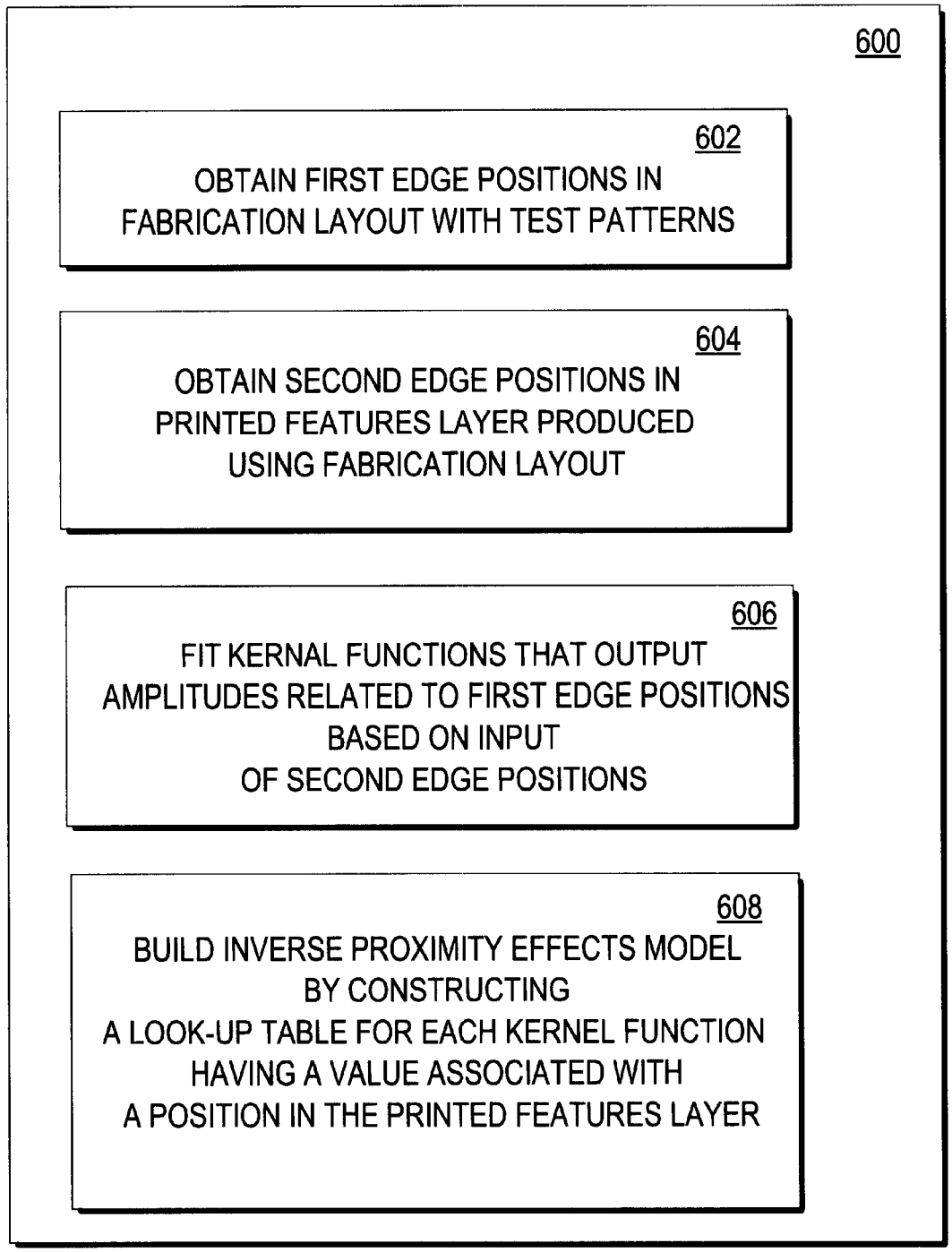
FIG. 6 is a flow diagram for building an inverse proximity effects model, according to an embodiment of another aspect.

FIG. 6 is a flow diagram for building an inverse proximity effects model, process 600. The process includes step 602, in which a first set of edge positions are obtained for test patterns in a fabrication layout. In step 604, a second set of edge positions are obtained. The edge positions in the second set belong to the printed features in the printed features layer produced using a mask formed from the fabrication layout of step 602. It is not necessary in step 604 that the fabrication process be performed to obtain the second set of edges. Both the first set of edge positions and the second set of edge positions may be available already as a result of building the conventional proximity effects model for a particular suite of fabrication equipment.

In step 606, kernel functions are fit to the first set of edge positions and second set of edge positions such that amplitudes related to positions in the first set of edge positions are output based on input of edges from the second set of edge positions. That is, the kernel functions are designed to output amplitudes related to edge positions in a fabrication layout when edge positions of the printed features layer are input.

In step 608, an inverse proximity effects model is built by constructing a lookup table for each kernel function. A lookup table contains a value for amplitude contribution at a position in the table related to a position in the printed features layer. Typically, the positions and orientations in the printed features layer are associated with rows and columns in the lookup table. The value in the lookup table at a particular row and column represents a convolution of the kernel function with an edge at a particular position in the printed features layer, and having a particular orientation.

Example Embodiment With Inverse Proximity Effects Model

Figure 7:
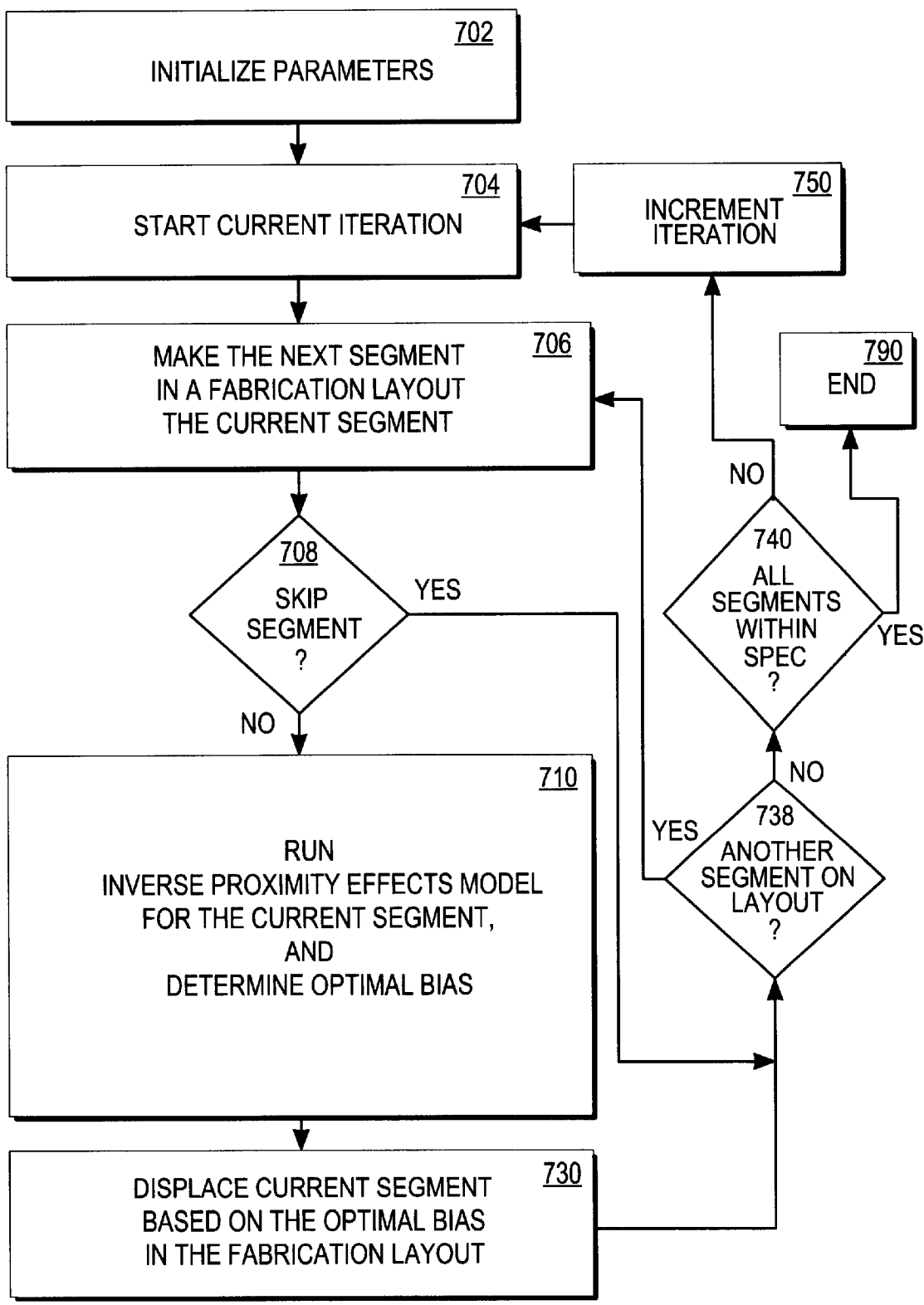
FIG. 7 is a flow diagram showing the iterative adjustment of a fabrication layout using an inverse proximity effects model, according to one embodiment of another aspect.

FIG. 7 is a flow diagram showing an iterative adjustment of a fabrication layout using an inverse proximity effects model, according to one embodiment of adjustment process 263 from FIG. 2.

In step 702, parameters used by the techniques are initialized. In step 704, the current iteration begins. A segment of the fabrication layout is visited only once per iteration. In step 706, one of the segments not yet visited in this iteration is made the current segment. In step 708, it is determined whether the current segment should be skipped. If the current segment is skipped, control passes to step 738 to determine whether another segment remains to be visited in the layout. If the current segment is not skipped, control passes to step 710 in which the inverse proximity effects model is run for the current segment. The inverse proximity effects model is run using the edges in the design layer as input. Then the output amplitudes indicating edges for the fabrication layout give the optimal positions to produce a printed features layer that agrees with the design layer. Also in step 710, an optimal bias is determined based on the locations for the fabrication layouts indicated by the outputs from the model run. In step 730, the layout is adjusted if necessary by moving the current segment to a position separated from the corresponding segment in the design layer by the optimal bias.

After it is determined in step 738, that another segment remains to be visited within the layout, control passes back to step 706 to make the next segment the current segment. If it is determined in step 738, that no other segment remains to be visited, then control passes to step 740 to determine whether all segments in the layout require corrections less than the specification tolerance. If so, then no further changes to the biases are required, and the process ends in step 790. If at least one segment requires a correction greater than the specification tolerance, then control passes to step 750 to increment to the next iteration, and visit at least one of the segments again.

In another embodiment, the inverse proximity effects model is not used iteratively on the layout, but is used once for each segment defined by an evaluation point and two dissection points in the layout.

Hardware Overview

Figure 8:
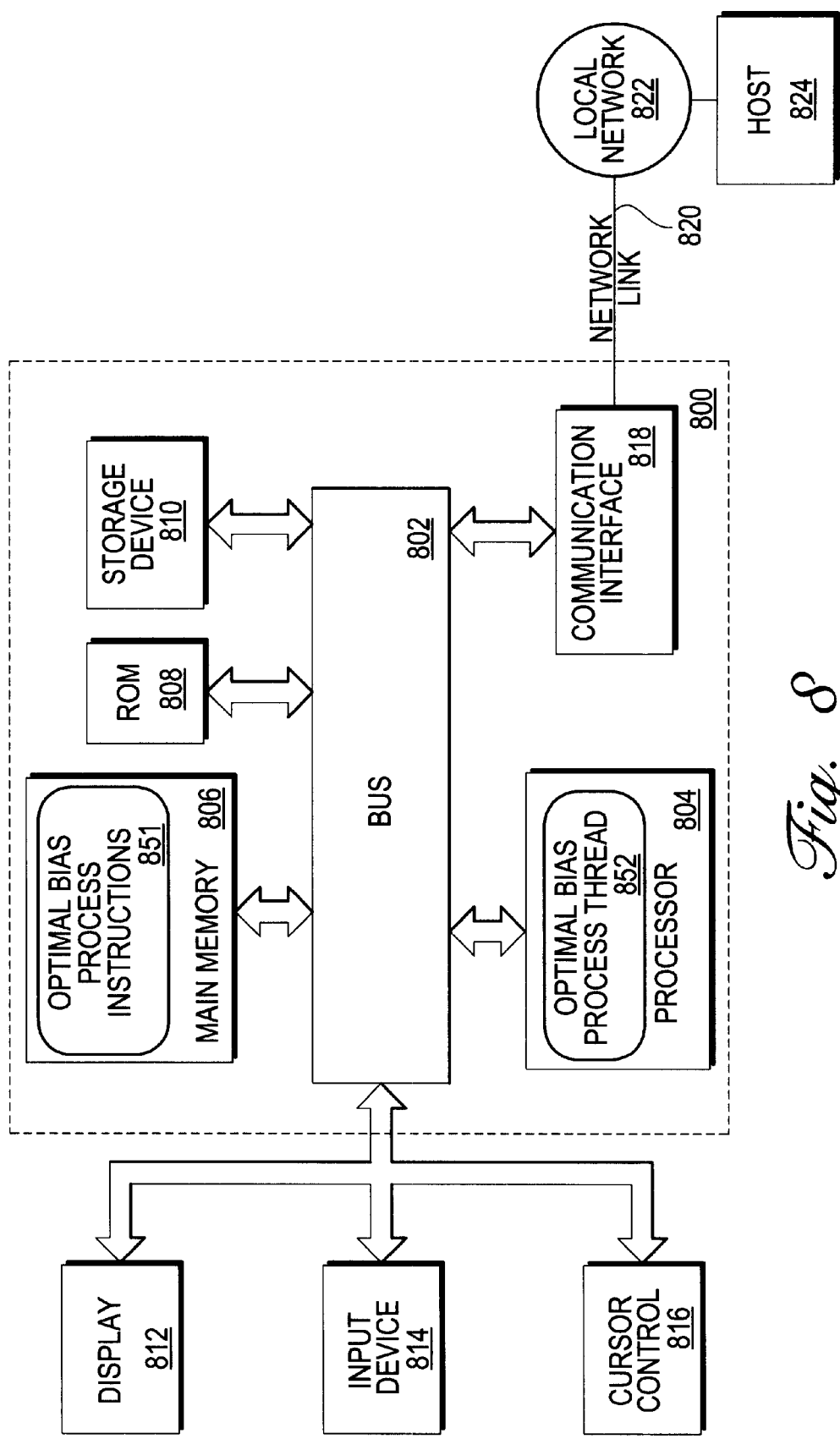
FIG. 8 is a block model of a computer system configured according to one embodiment.

FIG. 8 is a block diagram that illustrates a computer system 800 upon which an embodiment of the invention is implemented. Computer system 800 includes a bus 802 or other communication mechanism for communicating information, and a processor 804 coupled with bus 802 for processing information. Computer system 800 also includes a main memory 806, such as a random access memory (RAM) or other dynamic storage device, coupled to bus 802 for storing information and instructions to be executed by processor 804. Main memory 806 also may be used for storing temporary variables or other intermediate information during execution of instructions to be executed by processor 804. Computer system 800 further includes a read only memory (ROM) 808 or other static storage device coupled to bus 802 for storing static information and instructions for processor 804. A storage device 810, such as a magnetic disk or optical disk, is provided and coupled to bus 802 for storing information and instructions.

Computer system 800 may be coupled via bus 802 to a display 812, such as a cathode ray tube (CRT), for displaying information to a computer user. An input device 814, including alphanumeric and other keys, is coupled to bus 802 for communicating information and command selections to processor 804. Another type of user input device is cursor control 816, such as a mouse, a trackball, or cursor direction keys for communicating direction information and command selections to processor 804 and for controlling cursor movement on display 812. This input device typically has two degrees of freedom in two axes, a first axis (e.g., x) and a second axis (e.g., y), that allows the device to specify positions in a plane.

The invention is related to the use of computer system 800 for producing design layouts and fabrication layouts. According to one embodiment of the invention, optimal biases for fabrication layouts are provided by computer system 800 in response to processor 804 executing, e.g., as threads, one or more sequences of one or more instructions contained in main memory 806. For example, the optimal bias process runs as a thread 852 on processor 804 based on optimal bias process instructions 851 stored in main memory 806. Such instructions may be read into main memory 806 from another computer-readable medium, such as storage device 810. Execution of the sequences of instructions contained in main memory 806 causes processor 804 to perform the process steps described herein. In alternative embodiments, hard-wired circuitry may be used in place of or in combination with software instructions to implement the invention. Thus, embodiments of the invention are not limited to any specific combination of hardware circuitry and software.

The term "computer-readable medium" as used herein refers to any medium that participates in providing instructions to processor 804 for execution. Such a medium may take many forms, including but not limited to, non-volatile media, volatile media, and transmission media. Non-volatile media includes, for example, optical or magnetic disks, such as storage device 810. Volatile media includes dynamic memory, such as main memory 806. Transmission media includes coaxial cables, copper wire and fiber optics, including the wires that comprise bus 802. Transmission media can also take the form of acoustic or light waves, such as those generated during radio-wave and infra-red data communications.

Common forms of computer-readable media include, for example, a floppy disk, a flexible disk, hard disk, magnetic tape, or any other magnetic medium, a CD-ROM, any other optical medium, punchcards, papertape, any other physical medium with patterns of holes, a RAM, a PROM, and EPROM, a FLASH-EPROM, any other memory chip or cartridge, a carrier wave as described hereinafter, or any other medium from which a computer can read.

Various forms of computer readable media may be involved in carrying one or more sequences of one or more instructions to processor 804 for execution. For example, the instructions may initially be carried on a magnetic disk of a remote computer. The remote computer can load the instructions into its dynamic memory and send the instructions over a telephone line using a modem. A modem local to computer system 800 can receive the data on the telephone line and use an infra-red transmitter to convert the data to an infra-red signal. An infra-red detector can receive the data carried in the infra-red signal and appropriate circuitry can place the data on bus 802. Bus 802 carries the data to main memory 806, from which processor 804 retrieves and executes the instructions. The instructions received by main memory 806 may optionally be stored on storage device 810 either before or after execution by processor 804.

Computer system 800 also includes a communication interface 818 coupled to bus 802. Communication interface 818 provides a two-way data communication coupling to a network link 820 that is connected to a local network 822. For example, communication interface 818 may be an integrated services digital network (ISDN) card or a modem to provide a data communication connection to a corresponding type of telephone line. As another example, communication interface 818 may be a local area network (LAN) card to provide a data communication connection to a compatible LAN. Wireless links may also be implemented. In any such implementation, communication interface 818 sends and receives electrical, electromagnetic or optical signals that carry digital data streams representing various types of information.

Network link 820 typically provides data communication through one or more networks to other data devices. For example, network link 820 may provide a connection through local network 822 to a host computer 824. Local network 822 uses electrical, electromagnetic or optical signals that carry digital data streams. The signals through the various networks and the signals on network link 820 and through communication interface 818, which carry the digital data to and from computer system 800, are exemplary forms of carrier waves transporting the information. Computer system 800 can send messages and receive data, including program code, through the network(s), network link 820 and communication interface 818.

The received code may be executed by processor 804 as it is received, and/or stored in storage device 810, or other non-volatile storage for later execution. In this manner, computer system 800 may obtain application code in the form of a carrier wave.

In the foregoing specification, the invention has been described with reference to specific embodiments thereof. It will, however, be evident that various modifications and changes may be made thereto without departing from the broader spirit and scope of the invention. The specification and drawings are, accordingly, to be regarded in an illustrative rather than a restrictive sense.

What is claimed is:

1. A method of correcting a fabrication layout corresponding to an original fabrication layout for a printed features layer for proximity effects, the method comprising:

executing a routine implementing a proximity effects model to produce an initial output based on a first position for a segment in a fabrication layout displaced from a corresponding original edge in the original fabrication layout by a distance equal to an initial bias;

executing the routine implementing the proximity effects model to produce a second output based on a second position for the segment displaced from the corresponding original edge by a distance equal to a second bias;

determining an optimal bias for the segment based on the initial output and the second output; and displacing the segment in the fabrication layout from the corresponding edge based on the optimal bias.

2. The method of claim 1, said determining the optimal bias comprising:

associating a first position for a predicted printed edge with the initial output;

associating a second position for the predicted printed edge with the second output;

performing one of an interpolation and an extrapolation to obtain a third bias associated with the printed edge positioned substantially at the corresponding original edge; and setting the optimal bias based on the third bias.

3. The method of claim 1, wherein:

the method further comprises determining a first correction based on the initial output, said first correction associated with the initial bias, and determining a second correction based on the second output, said second correction associated with the second bias;

said determining the optimal bias comprises interpolating to a third bias associated with a target correction, and setting the optimal bias based on the third bias; and each correction is related to a difference between a first value of a property at a predicted printed edge and a second value of the property on the original edge.

4. The method of claim 3, wherein:

the first value is an amplitude threshold; and the second value is an amplitude at an evaluation point on the original edge, the amplitude derived from a corresponding output of the initial output and the second output.

5. The method of claim 3, wherein the target correction is zero.

6. The method of claim 3, wherein the target correction is a positive fraction less than one of the first correction.

7. The method of claim 6, wherein:

the method further comprises repeating said executing the routine and determining the optimal bias on the segment for a number of iterations until a termination criterion is satisfied; and the positive fraction decreases toward zero with increasing iterations.

8. The method of claim 3, said setting the optimal bias, further comprising:
   determining whether the first correction and second correction have opposite signs; and
   if the first correction and the second correction have opposite signs, then setting the optimal bias substantially equal to the third bias.

9. The method of claim 8, said setting the optimal bias, further comprising, if the first correction and the second correction do not have opposite signs, then setting a magnitude of the optimal bias substantially equal to a maximum bias.

10. The method of claim 8, said setting the optimal bias, further comprising, if the first correction and the second correction do not have opposite signs, then setting a magnitude of the optimal bias substantially to a previous optimal bias changed by a predetermined step size.

11. The method of claim 10, wherein:
   the method further comprises repeating said executing the routine and determining the optimal bias on the segment for a number of iterations until a termination criterion is satisfied; and
   the predetermined step size decreases from a maximum step size toward a minimum step size with increasing iterations.

12. The method of claim 4, wherein determining each correction of the first correction and the second correction based on the respective output of the initial output and the second output, further comprises:
   computing an amplitude slope associated with the respective output in a vicinity of the evaluation point on the original edge, the evaluation point corresponding to the segment in the fabrication layout; and
   dividing a difference between the amplitude threshold and the amplitude at the evaluation point by the slope.

13. The method of claim 12, said computing the slope comprising dividing a distance between two points in the vicinity of the evaluation point into a difference between amplitudes at the two points, each of the amplitudes derived from the respective output.

14. The method of claim 4, wherein determining a respective correction of the first correction and the second correction further comprises computing the amplitude at the evaluation point by interpolating between two amplitudes for two points straddling the evaluation point, each of the two amplitudes derived from a corresponding output of the initial output and the second output.

15. The method of claim 14, wherein an inner point of the two points is within an inner specification tolerance of the evaluation point and an outer point of the two points is within an outer specification tolerance of the evaluation point.

16. The method of claim 14, wherein the two points are equidistant from the evaluation point.

17. The method of claim 14, wherein the two points are separated by a model grid distance associated with the proximity effects model.

18. The method of claim 1, wherein a magnitude of a difference between the second bias and the initial bias is in a range from a predetermined minimum step size to a predetermined maximum step size.

19. The method of claim 3, wherein a sign of a difference between the second bias and the initial bias depends on a sign of the first correction.

20. The method of claim 1, wherein the initial bias equals zero.

21. The method of claim 1, said determining the optimal bias comprising:
   determining a first slope for the initial output;
   determining whether a magnitude of the first slope is less then a minimum contrast slope; and
   if the magnitude of the first slope is less than the minimum contrast slope, then flagging the segment as uncorrectable, and setting the optimal bias to zero.

22. The method of claim 1, further comprising repeating said executing the routine and determining the optimal bias on the segment for a number of iterations until a termination criterion is satisfied.

23. The method of claim 22, further comprising repeating said executing the routine and determining the optimal bias for a plurality of segments in the fabrication layout during each iteration of the number of iterations.

24. The method of claim 23, wherein:
   the method further comprises storing a pre-image value from the initial output during each iteration of the number of iterations; and
   said executing the routine further comprises
      computing a change in pre-image due to changes in bias associated with one or more segments of the segment and the plurality of segments, and
      producing an output based on a sum of the change in pre-image and the pre-image value stored during a previous iteration.

25. The method of claim 23, said executing the routine further comprising inputting one or more segments of the segment and the plurality of segments positioned according to corresponding biases determined on a previous iteration.

26. The method of claim 25, wherein the one or more segments are within a halo distance of the evaluation point.

27. The method of claim 22, wherein:
   a magnitude of a difference between the second bias and the initial bias is a step size selected from a range from a predetermined minimum step size to a predetermined maximum step size; and
   the method further comprises decreasing the step size with increasing iterations.

28. The method of claim 27, said decreasing the step size comprising computing the step size for iteration I in response to a sum of the minimum step size and a quantity, the quantity equal to a difference between the maximum step size and the minimum step size divided by a fading factor raised to a power equal to I, the fading factor having a predetermined value greater than 1.

29. The method of claim 26, further comprising decreasing the halo distance with increasing iterations between a predetermined maximum halo distance less than or equal to a model radius and a predetermined minimum halo distance.

30. The method of claim 29, said decreasing the halo distance comprising computing the halo distance for iteration I in response to a sum of the minimum halo distance and a quantity, the quantity equal to a difference between the maximum halo distance and the minimum halo distance divided by a factor raised to a power equal to I, the factor having a predetermined value greater than 1.

31. The method of claim 22, wherein:
   the proximity effects model comprises a first integer number M of kernel functions;
   said executing the routine further comprises obtaining values for a second integer number N of kernel functions; and
   the number N is selected from a range from a predetermined minimum number of kernel functions to the number M.

32. The method of claim 31, further comprising decreasing the number N based on iteration number I.

33. The method of claim 32, said decreasing the number N comprising computing the number N for iteration number I in response to a sum of the minimum number of kernel functions and a quantity, the quantity equal to a difference between the number M and the minimum number of kernel functions divided by a factor raised to a power equal to I, the factor having a predetermined value greater than 1.

34. The method of claim 22, wherein the optimal bias is not determined for the segment on a particular iteration of the number of iterations if a skip criterion is satisfied.

35. The method of claim 34, wherein the skip criterion is satisfied if, for two consecutive iterations before the particular iteration, said determining the optimal bias has not changed the optimal bias.

36. The method of claim 34, wherein the skip criterion is satisfied if no other segment within a halo distance has an optimal bias that has changed since said determining the optimal bias for the segment last changed the optimal bias for the segment on an iteration before the particular iteration.

37. The method of claim 2, said setting the optimal bias in response to the third bias further comprising, if the third bias differs from the initial bias by less than a target tolerance, then setting the optimal bias equal to the initial bias, wherein the target tolerance is less than or equal to a specification tolerance.

38. The method of claim 1, wherein:
the method further comprises,
determining a slope at the original edge based on the initial output, and
determining whether the slope is less than a predetermined minimum contrast slope; and
said determining the optimal bias comprises, if it is determined that the slope is less than the minimum contrast slope, then setting the optimal bias equal to the initial bias.

39. The method of claim 38, the method further comprising, if it is determined that the slope is not less than the minimum contrast slope, then:
determining whether the slope is less than a predetermined high contrast slope; and
if it is determined that the slope is less than the high contrast slope, setting the second bias based on a quantity proportional to the slope.

40. The method of claim 39, the method further comprising, if it is determined that the slope is not less than the high contrast slope, then setting the second bias based on a quantity proportional to a first correction term, the first correction term substantially equal to a difference divided by the slope, the difference computed between an amplitude at an evaluation point on the original edge and an amplitude threshold derived from the initial output.

41. The method of claim 1, wherein the optimal bias is not greater than a predetermined maximum bias.

42. The method of claim 22, said setting the optimal bias based on the third bias comprising setting the optimal bias based on a product of the third bias and a damping factor not greater than 1.0.

43. The method of claim 42, further comprising increasing the damping factor with increasing iterations between a predetermined minimum damping factor less than 1.0 and 1.0.

44. The method of claim 43, said increasing the damping factor comprising computing the damping factor for iteration I in response to a difference between 1.0 and a quantity, the quantity equal to a difference between 1.0 and the minimum damping factor divided by a fading factor raised to a power equal to I, the fading factor having a predetermined value greater than 1.

45. The method of claim 23, wherein said repeating is performed for non-corner segments of the plurality of segments before repeating is performed for corner-segments of the plurality of segments.

46. The method of claim 45, wherein the corner-segments and the non-corner segments are corner-segments and non-corner segments, respectively, on edges of a first polygon in the original fabrication layout.

47. The method of claim 1, wherein:
the method further comprises executing the routine implementing the proximity effects model to produce a third output based on a third position for the segment displaced from the corresponding original edge by a distance equal to a third bias; and
said determining the optimal bias is further based on the third output.

48. The method of claim 47, wherein the second bias is based on the initial output and the third bias is based on the second output.

49. The method of claim 1, wherein:
the method further comprises executing the routine implementing the proximity effects model to produce a third output based on a position for a second segment in the fabrication layout; and
said determining the optimal bias is further based on the third output.

50. The method of claim 49, wherein the second segment is within a pre-defined neighborhood distance of the segment.

51. The method of claim 49, wherein the second segment is adjacent to the segment in the original fabrication layout.

52. The method of claim 49, wherein the second segment is on the original edge.

53. The method of claim 49, wherein the second segment is a non-corner segment.

54. A computer readable medium for correcting a fabrication layout corresponding to an original fabrication layout for proximity effects, the computer readable medium carrying instructions to cause one or more processors to perform:
executing a routine implementing a proximity effects model to produce an initial output based on a first position for a segment in a fabrication layout displaced from a corresponding original edge in the original fabrication layout by a distance equal to an initial bias;
executing the routine implementing the proximity effects model to produce a second output based on a second position for the segment displaced from the corresponding original edge by a distance equal to a second bias;
determining an optimal bias for the segment based on the initial output and the second output; and
displacing the segment in the fabrication layout from the corresponding edge based on the optimal bias.

55. A carrier wave for correcting a fabrication layout corresponding to an original fabrication layout for proximity effects, the carrier wave carrying instructions to cause one or more processors to perform:
executing a routine implementing a proximity effects model to produce an initial output based on a first position for a segment in a fabrication layout displaced from a corresponding original edge in the original fabrication layout by a distance equal to an initial bias;
executing the routine implementing the proximity effects model to produce a second output based on a second position for the segment displaced from the corresponding original edge by a distance equal to a second bias;

determining an optimal bias for the segment based on the initial output and the second output; and displacing the segment in the fabrication layout from the corresponding edge based on the optimal bias.

56. A computer system for correcting a fabrication layout corresponding to an original fabrication layout for proximity effects, the computer system comprising:

a computer readable medium carrying data representing the original fabrication layout; and one or more processors coupled to the computer readable medium, the one or more processors configured for executing a routine implementing a proximity effects model to produce an initial output based on a first position for a segment in a fabrication layout displaced from a corresponding original edge in the original fabrication layout by a distance equal to an initial bias, executing the routine implementing the proximity effects model to produce a second output based on a second position for the segment displaced from the corresponding original edge by a distance equal to a second bias, determining an optimal bias for the segment based on the initial output and the second output, and displacing the segment in the fabrication layout from the corresponding edge based on the optimal bias.

57. A system for correcting a fabrication layout corresponding to an original fabrication layout for proximity effects, the system comprising:

a proximity effects model to produce an initial output based on a first position for a segment in a fabrication layout displaced from a corresponding original edge in the original fabrication layout by a distance equal to an initial bias, and to produce a second output based on a second position for the segment displaced from the corresponding original edge by a distance equal to a second bias, a means for determining an optimal bias for the segment based on the initial output and the second output, and a means for displacing the segment in the fabrication layout from the corresponding edge based on the optimal bias.

58. A method for fabricating a printed features layer including features corrected for proximity effects, the method comprising:

executing a routine implementing a proximity effects model to produce an initial output based on a first position for a segment in a fabrication layout displaced from a corresponding original edge in an original fabrication layout for the printed features layer by a distance equal to an initial bias;

executing the routine implementing the proximity effects model to produce a second output based on a second position for the segment displaced from the corresponding original edge by a distance equal to a second bias;

determining an optimal bias for the segment based on the initial output and the second output;

displacing the segment in the fabrication layout from the corresponding edge based on the optimal bias;

producing a mask based on the fabrication layout with the segment displaced; and producing the printed features layer in a fabrication process using the mask.

59. A mask for fabricating a printed features layer, the mask including an opaque region having a segment corrected for proximity effects, the segment corresponding to at least one portion of a target edge in an original fabrication layout for the printed features layer, wherein:

the segment is displaced from the corresponding portion by a correction distance;

the correction distance is based on an initial output of a proximity effects model and a second output of the proximity effects model;

the initial output is based on a first position for a segment in a fabrication layout displaced from the corresponding portion by a distance equal to an initial bias; and the second output is based on a second position for the segment displaced from the corresponding portion by a distance equal to a second bias.

60. A device having a proximity-corrected element, the device produced using a mask including an opaque region having a segment corrected for proximity effects, the segment corresponding to at least one portion of a target edge in an original fabrication layout for the printed features layer, wherein:

the segment is displaced from the corresponding portion by a correction distance;

the correction distance is based on an initial output of a proximity effects model and a second output of the proximity effects model;

the initial output is based on a first position for a segment in a fabrication layout displaced from the corresponding portion by a distance equal to an initial bias; and the second output is based on a second position for the segment displaced from the corresponding portion by a distance equal to a second bias.

* * * * *